US006928172B2

(12) United States Patent
Ohta

(10) Patent No.: US 6,928,172 B2
(45) Date of Patent: Aug. 9, 2005

(54) AUTOMATIC SOUND FIELD CORRECTING SYSTEM

(75) Inventor: Yoshiki Ohta, Saitama (JP)

(73) Assignee: Pioneer Corporation, Tokyo (JP)

( * ) Notice: Subject to any disclaimer, the term of this patent is extended or adjusted under 35 U.S.C. 154(b) by 680 days.

(21) Appl. No.: 09/781,277

(22) Filed: Feb. 13, 2001

(65) Prior Publication Data

US 2001/0016047 A1 Aug. 23, 2001

(30) Foreign Application Priority Data

Feb. 14, 2000 (JP) ..................................... P.2000-035033

(51) Int. Cl.[7] .................................................. H03G 5/00

(52) U.S. Cl. ........................ 381/98; 381/103; 381/94.3; 381/101; 381/102; 381/107; 381/108

(58) Field of Search ......................... 381/98, 103, 94.3, 381/101, 102, 107, 108, 104, 9

(56) References Cited

U.S. PATENT DOCUMENTS 4,739,513 A 4/1988 Kunugi et al.
5,386,478 A * 1/1995 Plunkett ..................... 381/103
5,581,621 A * 12/1996 Koyama et al. ............ 381/103

FOREIGN PATENT DOCUMENTS

JP 10-136498 5/1998
WO WO 98/20706 5/1998

* cited by examiner

*Primary Examiner*—Sinh Tran
*Assistant Examiner*—Justin Michalski
(74) *Attorney, Agent, or Firm*—Sughrue Mion, PLLC

(57) ABSTRACT

In correcting the sound field, loudspeakers $6_{FL}$ to $6_{WF}$ are sounded by the noise. The attenuation factors of the inter-band attenuators $ATF_{11}$ to $ATF_{ki}$ for adjusting gains of the band-pass filters $BPF_{11}$ to $BPF_{ki}$ to the frequency in respective channels are corrected based on detection results of the reproduced sounds of the loudspeakers $6_{FL}$ to $6_{WF}$. The attenuation factors of channel-to-channel attenuators $ATG_1$ to $ATG_5$ are corrected based on the detection results of the reproduced sounds of the loudspeakers $6_{FL}$ to $6_{WF}$. The delay times of delay circuits $DLY_1$ to $DLY_5$ are corrected based on the detection results of the reproduced sounds of the loudspeakers $6_{FL}$ to $6_{WF}$. The attenuation factor of a channel-to-channel attenuator $ATG_k$ is corrected based on the detection result of the reproduced sound of the loudspeaker $6_{WF}$ as the subwoofer. Therefore, the levels of the reproduced sounds reproduced by the loudspeakers $6_{FL}$ to $6_{WF}$ are adjusted to be made flat over the audio frequency band.

11 Claims, 11 Drawing Sheets

AUTOMATIC SOUND FIELD CORRECTING SYSTEM

BACKGROUND OF THE INVENTION

1. Field of the Invention

The present invention relates to an automatic sound field correcting system for automatically correcting a sound field characteristic in an audio system having a plurality of loudspeakers.

2. Description of the Related Art

The audio system that is equipped with a plurality of loudspeakers to provide a high quality sound field space is required to produce automatically the proper sound field space that can give a presence. In other words, when the listener tries to get the proper sound field space by himself or herself by operating the audio system, it is extremely hard to properly adjust a phase characteristic, a frequency characteristic, a sound pressure level, etc. of a reproduced sound that is played back via a plurality of loudspeakers. For this reason, it is required to correct automatically the sound field characteristic on the audio system side.

In the prior art, as the audio system of this type, the audio system disclosed in Utility Model Application Publication (KOKAI) Hei 6-13292 has been known. In this audio system in the prior art, an equalizer that receives audio signals on a plurality of channels to adjust these frequency characteristics of respective audio signals and a plurality of delay circuits that delay the audio signals output from the equalizer every channel are provided, and then outputs of respective delay circuits are supplied to a plurality of loudspeakers.

Also, in order to correct the sound field characteristic, there are provided a pink noise generator, an impulse generator, a selector circuit, a microphone used to measure the reproduced sound being reproduced by the loudspeakers, a frequency analyzer, and a delay time calculator. Then, a pink noise generated by the pink noise generator is supplied to the equalizer via the selector circuit, and an impulse signal generated by the impulse generator is directly supplied to the loudspeakers via the selector circuit.

Upon correcting the phase characteristic of the sound field space, propagation delay times of the impulse sound from the loudspeakers to a listening position are measured by measuring the impulse sound reproduced via the loudspeakers by the microphone while supplying directly the impulse signal from the above impulse generator to the loudspeakers and then analyzing the measured signals by using the delay time calculator.

In other words, the propagation delay times of respective impulse sounds are measured by directly supplying the impulse signal to individual loudspeakers while shifting a time and calculating time differences from points of time when respective impulse signals are supplied to respective loudspeakers to points of time when respective impulse sounds being reproduced by every loudspeaker come up to the microphone by using the delay time calculator. Thus, the phase characteristic of the sound field space can be corrected by adjusting the delay times of respective channels of the above delay circuit based on respective measured propagation delay times.

Also, upon correcting the frequency characteristic of the sound field space, the pink noise is supplied from the pink noise generator to the equalizer and then the reproduced sounds of the pink noise being reproduced via a plurality of loudspeakers are measured by the microphone, and then frequency characteristics of these measured signals are analyzed by the frequency analyzer. Thus, the frequency characteristic of the sound field space can be corrected by feedback-controlling the frequency characteristic of the equalizer based on the analyzed results.

In the audio system in the prior art, as described above, in order to correct the frequency characteristic of the sound field space, such a method is employed that the frequency characteristics of the reproduced sounds of the pink noise are analyzed by using a group of narrow-band filters and then the analyzed results are fed back to the equalizer.

Here, upon producing the reproduced sounds of the pink noise, the pink noise is supplied to the equalizer after the frequency characteristic of the equalizer is set to a frequency characteristic which mates with the audio playback. Accordingly, the reproduced sounds of the pink noise being reproduced via a plurality of loudspeakers reach the microphone and then the frequency characteristics of the reproduced sound of the pink noise are analyzed by a group of narrow-band filters.

However, in case the frequency characteristics of measured signals derived from the reproduced sounds of the pink noise being reproduced via a plurality of (all) loudspeakers are frequency-analyzed by individual narrow-band filters in a group of narrow-band filters, the analyzed result suitable for the frequency characteristic of the equalizer cannot be obtained with good precision. As a result, there is such a subject that, if the frequency characteristic of the equalizer is feedback-controlled based on the analyzed result, it becomes difficult to correct properly the frequency characteristic of the sound field space.

In addition, there is such another subject that, since the phase characteristic of the sound field space is corrected based on the delay times that are obtained by supplying directly the impulse signal to the loudspeakers, the phase characteristic of the overall audio system cannot be corrected into the phase characteristic that can produce the proper sound field space.

SUMMARY OF THE INVENTION

It is an object of the present invention to overcome the above subjects in the prior art and provide an automatic sound field correcting system capable of providing a higher quality sound field space.

In order to achieve the above object, according to the present invention, there is provided an automatic sound field correcting system in an audio system for supplying a plurality of input audio signals to a plurality of sound generating means via a plurality of signal transmission lines, each of the plurality of signal transmission lines including a frequency dividing means having a plurality of frequency discriminating means having a narrow frequency band and having a different frequency discriminating characteristic mutually, a plurality of in-channel level adjustors provided to correspond to respective frequency discriminating means, for adjusting levels of respective signals that are discriminated by the frequency discriminating means, a channel-to-channel level adjusting means for adjusting levels of the audio signals, and a delaying means for adjusting delay times of the audio signals, whereby the input audio signals are supplied to the sound generating means via the frequency dividing means, the in-channel level adjusting means, the channel-to-channel level adjusting means, and the delaying means, the correcting system comprising a noise generating means for supplying a noise to respective signal transmission lines independently in correcting a sound field; detecting means for detecting reproduced sounds generated from the noise and reproduced by the sound generating means; in-channel level correcting means for correcting an adjusted amount of the plurality of in-channel level adjusting means based on detection results of the detecting means; channel-to-channel level correcting means for correcting an adjusted amount of the plurality of channel-to-channel level adjusting means based on the detection results of the detecting means; and phase characteristic correcting means for calculating phase characteristics of the reproduced sounds reproduced by the sound generating means based on the detection results of the detecting means and also correcting delay times of the delaying means based on calculated phase characteristics.

In the automatic sound field correcting system having such configuration, the frequency dividing means, the in-channel level adjusting means, the channel-to-channel level adjusting means, and the delaying means are provided in the signal transmission lines via which the audio sound is reproduced.

In such configuration, in correcting the sound field, the noise is supplied from the noise generating means to the signal transmission lines individually, and then respective reproduced sounds generated correspondingly are detected by the detecting means. Since the in-channel level correcting means corrects the adjusted amount of the in-channel level adjusting means based on the detection results of the detecting means, respective levels of the audio signals that are frequency-discriminated by respective frequency discriminating means in the frequency dividing means can be corrected precisely. Also, since the channel-to-channel level correcting means corrects the adjusted amount of the channel-to-channel level adjusting means based on the detection results of the detecting means, the levels of the audio signals supplied to respective sound generating means can be corrected precisely. In addition, since the phase characteristic correcting means corrects the delay times of the delaying means based on the detection results of the detecting means, the phases of the audio signals supplied to respective sound generating means are adjusted.

Accordingly, the frequency characteristic and the phase characteristic of the audio signals that are supplied to respective sound generating means can be automatically and precisely corrected in reproducing the audio sound. Also, the rationalization of the phase characteristic and the frequency characteristic of the reproduced sounds reproduced by respective sound generating means at the listening position can be achieved. Thus, the high quality sound field space with the presence can be provided.

In particular, the sound generating means are caused to reproduce the reproduced sounds based on the noise that is supplied to the sound generating means via the frequency dividing means, the in-channel level adjusting means, the channel-to-channel level adjusting means, and the delaying means, all being provided in the signal transmission lines via which the audio sound is reproduced, and also the frequency dividing means, the in-channel level adjusting means, the channel-to-channel level adjusting means, and the delaying means are corrected based on the detection results of the reproduced sounds. Therefore, the correction of the sound field can be performed under the same condition as the reproduction of the audio sound. For this reason, the sound field correction can be executed while totally taking account of the characteristic of the overall audio system and the characteristic of the sound field space.

Also, an automatic sound field correcting system of the present invention is an automatic sound field correcting system in an audio system for supplying a plurality of input audio signals to all frequency band sound generating means and a low frequency band exclusively reproducing sound generating means via a plurality of signal transmission lines, each of the plurality of signal transmission lines including a frequency dividing means having a plurality of frequency discriminating means having a narrow frequency band and having a different frequency discriminating characteristic mutually, a plurality of in-channel level adjusting means provided to correspond to respective frequency discriminating means, for adjusting levels of respective signals that are discriminated by the frequency discriminating means, a channel-to-channel level adjusting means for adjusting levels of the audio signals, and a delaying means for adjusting delay times of the audio signals, whereby the input audio signals are supplied to the sound generating means via the frequency dividing means, the in-channel level adjusting means, the channel-to-channel level adjusting means, and the delaying means, the correcting system comprising a noise generating means for supplying a noise to respective signal transmission lines independently in correcting a sound field; detecting means for detecting reproduced sounds generated from the noise and reproduced by the sound generating means; in-channel level correcting means for correcting an adjusted amount of the plurality of in-channel level adjusting means based on detection results of the detecting means; first channel-to-channel level correcting means for correcting an adjusted amount of the plurality of channel-to-channel level adjusting means of the signal transmission lines, in which the all frequency band sound generating means are provided, based on the detection results of the detecting means; second channel-to-channel level correcting means for correcting an adjusted amount of the plurality of channel-to-channel level adjusting means of the signal transmission lines, in which the low frequency band exclusively reproducing sound generating means are provided, based on the detection results of the detecting means; and phase characteristic correcting means for calculating phase characteristics of the reproduced sounds reproduced by respective sound generating means based on the detection results of the detecting means and also correcting delay times of the delaying means based on calculated phase characteristics.

Also, the second channel-to-channel level correcting means corrects an adjusted amount of the channel-to-channel level adjusting means of the signal transmission line in which the low frequency band exclusively reproducing sound generating means is provided such that levels of reproduced sounds reproduced by all frequency band sound generating means are set substantially equal to a level of a reproduced sound reproduced by the low frequency band exclusively reproducing sound generating means.

According to the automatic sound field correcting system having such configuration, since the correction of the sound field can be carried out under the same condition as the reproduction of the audio sound, such correction of the sound field can be implemented while totally taking account of the characteristic of the overall audio system and the characteristic of the sound field environment and also a total level of the reproduced sound reproduced by the all frequency band sound generating means and the low frequency band exclusively reproducing sound generating means at the listening position can be made flat over the full audio frequency band.

In other words, the first channel-to-channel level correcting means corrects an adjusted amount of the channel-to-channel level adjusting means for the all frequency band sound generating means, and the second channel-to-channel level correcting means corrects an adjusted amount of the channel-to-channel level adjusting means for the low frequency A band exclusively reproducing sound generating means. Accordingly, the reproduced sound, that is offensive to the ear, generated because the level of the reproduced sound at a certain frequency in the audio frequency band is enhanced or weakened can be prevented, and also the sound field space with the presence can be implemented.

DETAILED DESCRIPTION OF THE PREFERRED EMBODIMENTS

Figure 1:
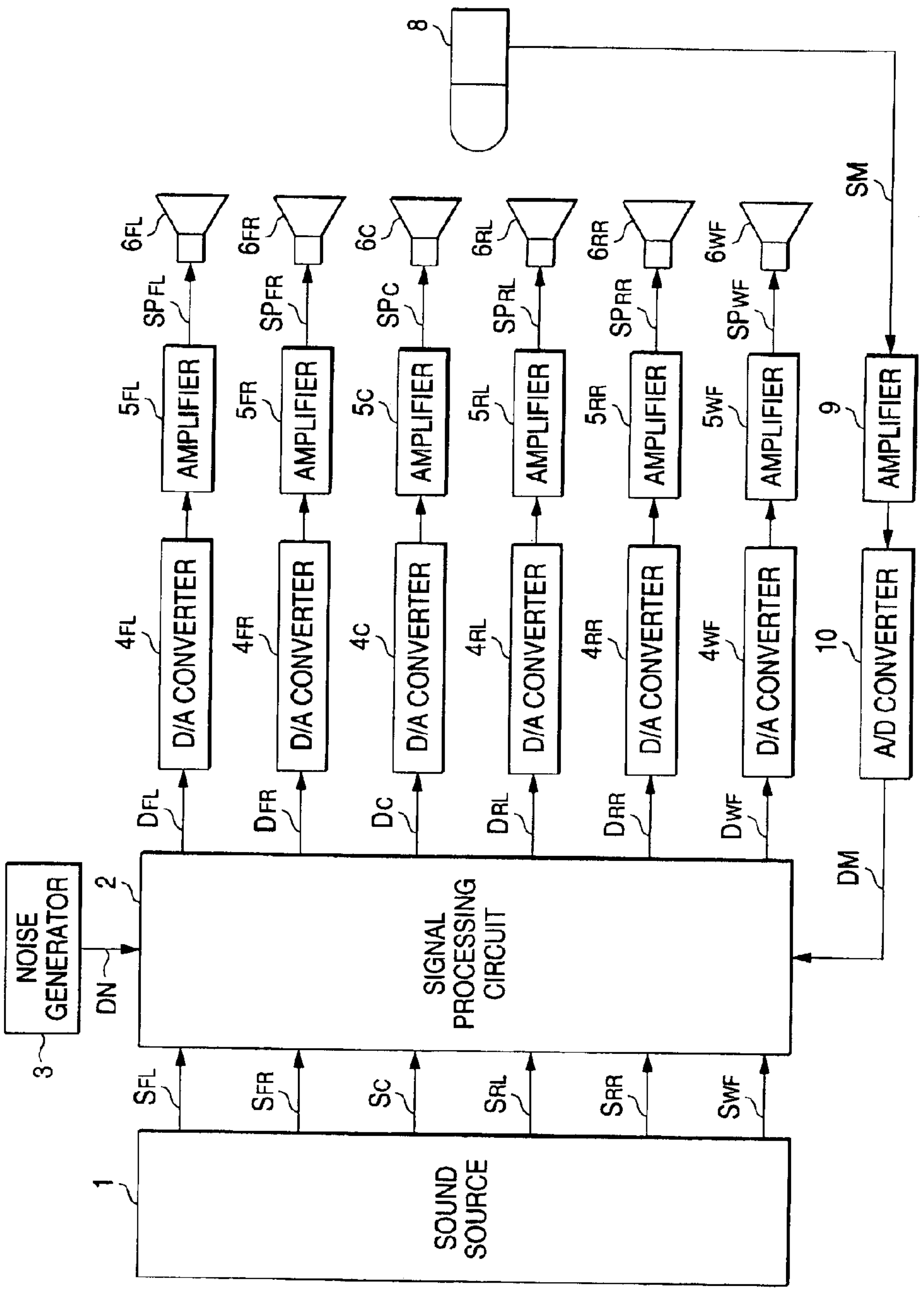
FIG. 1 is a block diagram showing a configuration of an audio system including an automatic sound field correcting system according to the present embodiment.
Figure 2:
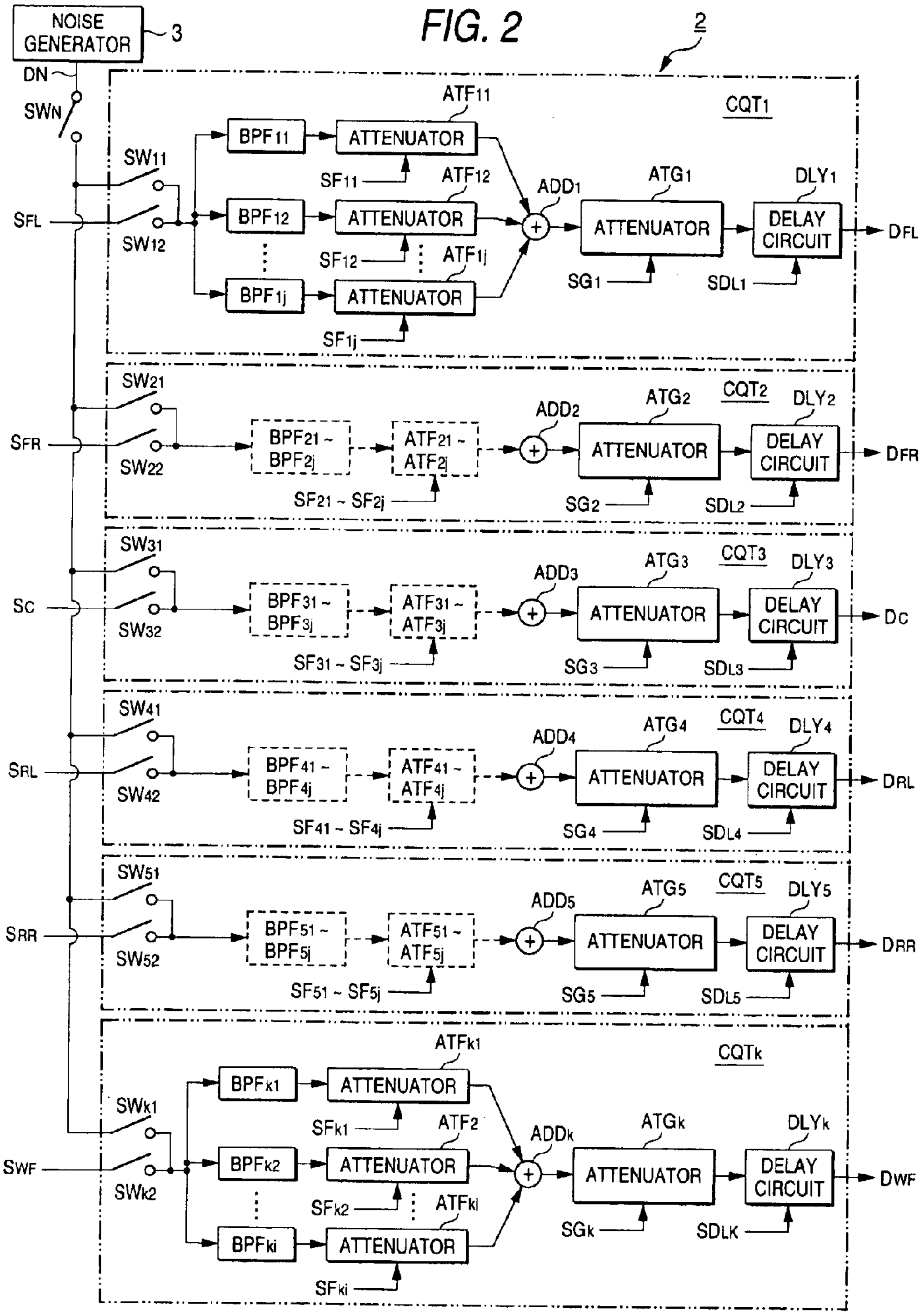
FIG. 2 is a block diagram showing a configuration of the automatic sound field correcting system according to the present embodiment.
Figure 3:
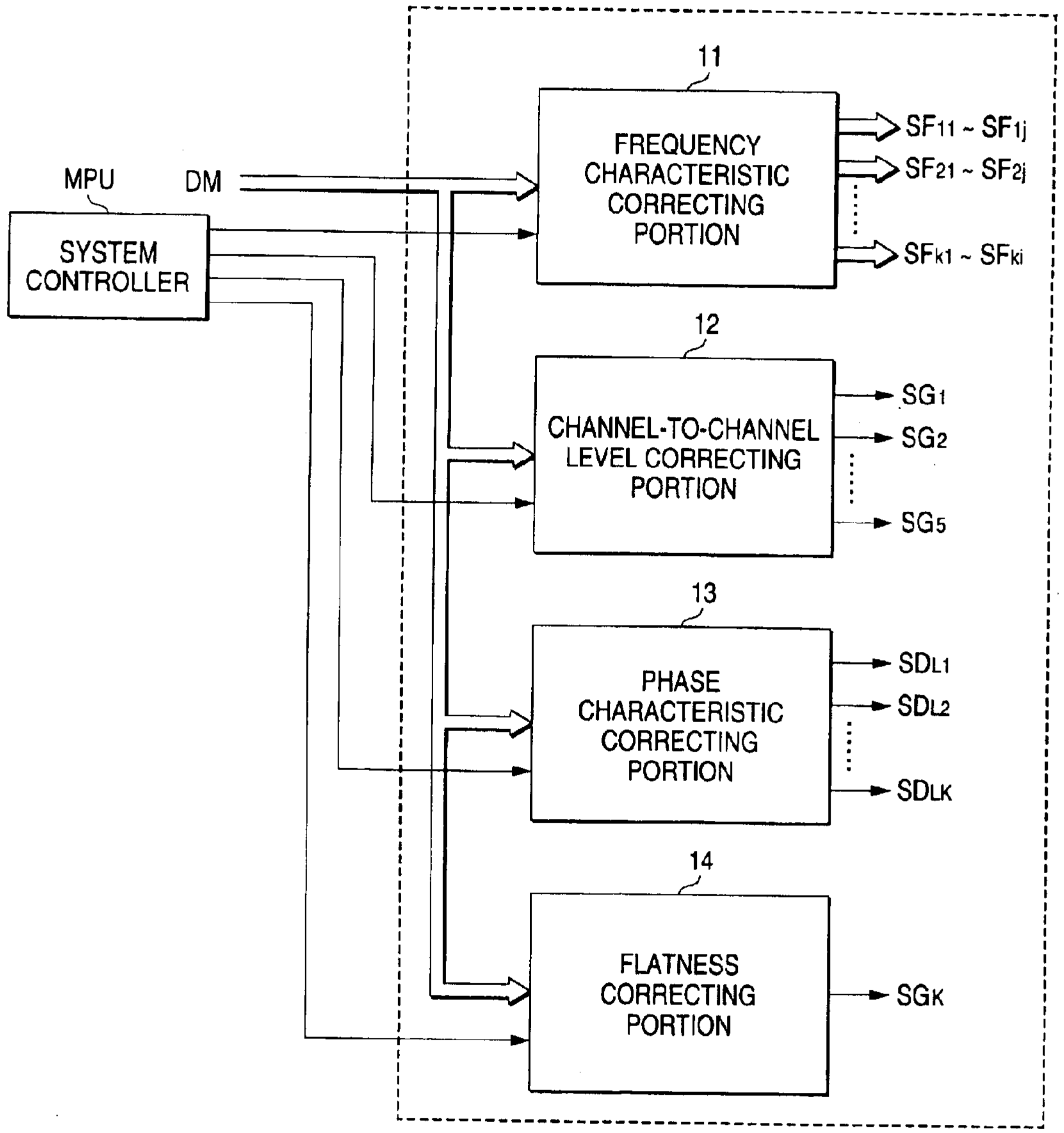
FIG. 3 is a block diagram showing a pertinent configuration of the automatic sound field correcting system according to the present embodiment.
Figure 4:
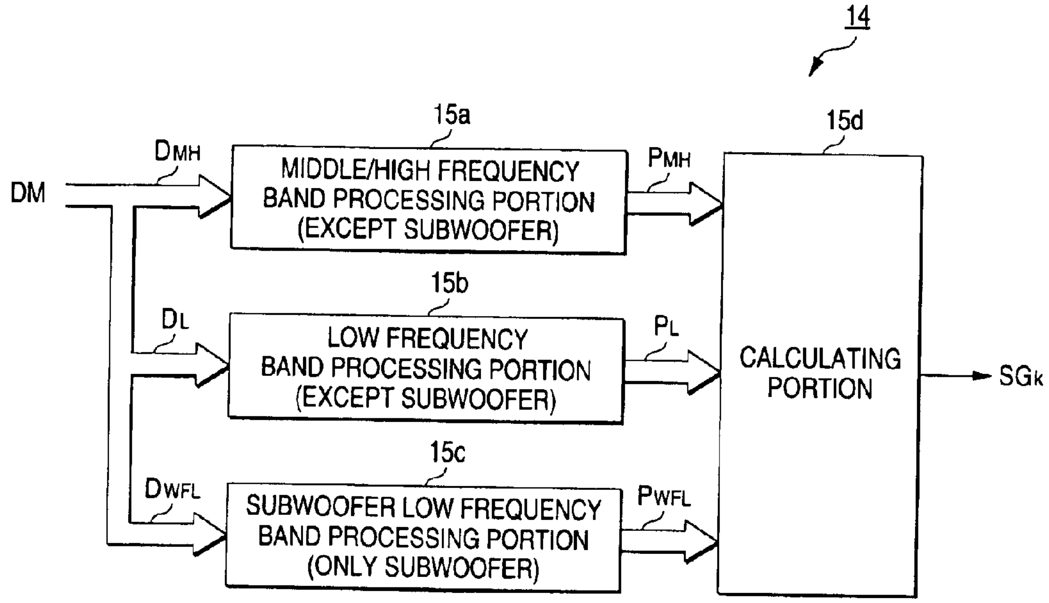
FIG. 4 is a block diagram showing another pertinent configuration of the automatic sound field correcting system according to the present embodiment.

An embodiment of an automatic sound field correcting system of the present invention will be explained with reference to the accompanying drawings hereinafter. FIG. 1 is a block diagram showing a configuration of an audio system including the automatic sound field correcting system according to the present embodiment. FIG. 2 to FIG. 4 are block diagrams showing the configuration of the automatic sound field correcting system.

In FIG. 1, a signal processing circuit 2 to which digital audio signals $S_{FL}$, $S_{FR}$, $S_C$, $S_{RL}$, $S_{RR}$, $S_{WF}$ are supplied from a sound source 1 such as a CD (Compact Disk) player, a DVD (Digital Video Disk or Digital Versatile Disk) player, etc. via a signal transmission line having a plurality of channels, and a noise generator 3 are provided to the present audio system.

Also, D/A converters $\mathbf{4}_{FL}$, $\mathbf{4}_{FR}$, $\mathbf{4}_C$, $\mathbf{4}_{RL}$, $\mathbf{4}_{RR}$, $\mathbf{4}_{WF}$ for converting digital outputs $D_{FL}$, $D_{FR}$, $D_C$, $D_{RL}$, $D_{WF}$ which are signal-processed by the signal processing circuit 2 into analog signals, and amplifiers $\mathbf{5}_{FL}$, $\mathbf{5}_{FR}$, $\mathbf{5}_C$, $\mathbf{5}_{RL}$, $\mathbf{5}_{RR}$, $\mathbf{5}_{WF}$ for amplifying respective analog audio signals being output from these D/A converters are provided. Respective analog audio signals $SP_{FL}$, $SP_{FR}$, $SP_C$, $SP_{RL}$, $SP_{RR}$, $SP_{WF}$ amplified by these amplifiers are supplied to loudspeakers $\mathbf{6}_{FL}$, $\mathbf{6}_{FR}$, $\mathbf{6}_C$, $\mathbf{6}_{RL}$, $\mathbf{6}_{RR}$, $\mathbf{6}_{WF}$ on a plurality of channels arranged in a listening room 7, etc., as shown in FIG.7, to sound them.

In addition, a microphone 8 for collecting reproduced sounds at a listening position RV, an amplifier 9 for amplifying a sound collecting signal SM output from the microphone 8, and an A/D converter 10 for converting an output of the amplifier 9 into digital sound collecting data DM to supply to the signal processing circuit 2 are provided.

Then, the present audio system provides a sound field space with a presence to the listener at the listening position RV by sounding all frequency band type loudspeakers $\mathbf{6}_{FL}$, $\mathbf{6}_{FR}$, $\mathbf{6}_C$, $\mathbf{6}_{RL}$, $\mathbf{6}_{RR}$ each has a frequency characteristic that enables an almost full range of the audio frequency band to reproduce, and a low frequency band exclusively reproducing loudspeaker $\mathbf{6}_{WF}$ that has a frequency characteristic to reproduce only the so-called heavy and low sound.

Figure 7:
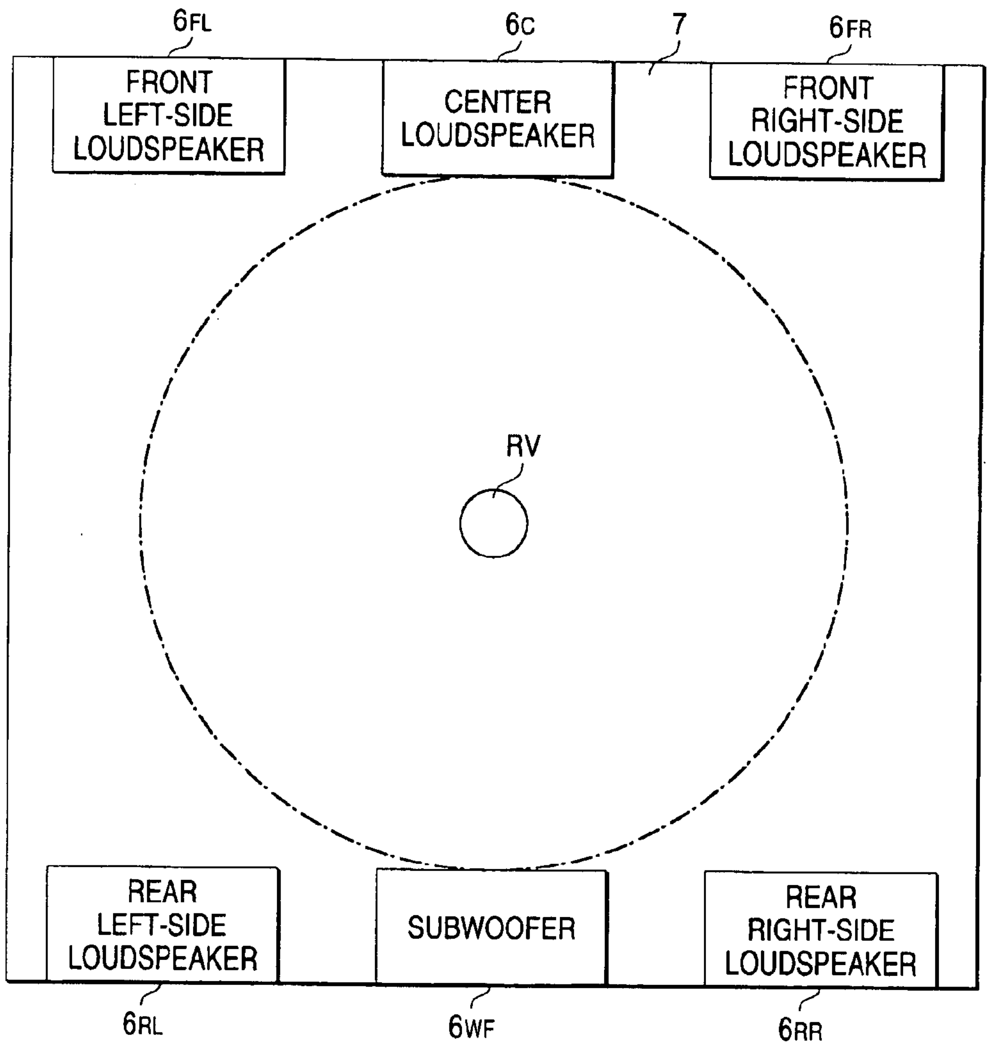
FIG. 7 is a view showing an example of arrangement of loudspeakers.

For example, as shown in FIG. 7, in the case that the listener arranges the front loudspeakers (front left-side loudspeaker, front right-side loudspeaker) $\mathbf{6}_{FL}$, $\mathbf{6}_{FR}$ on two right and left channels and the center loudspeaker $\mathbf{6}_C$ in front of the listening position RV, arranged the rear loudspeakers (rear left-side loudspeaker, rear right-side loudspeaker) $\mathbf{6}_{RL}$, $\mathbf{6}_{RR}$ on two right and left channels at the rear of the listening position RV, and arranges the low frequency band exclusively reproducing subwoofer $\mathbf{6}_{WF}$ at any position according to his or her taste, the automatic sound field correcting system installed in the present audio system can implement the sound field space with the presence by sounding six loudspeakers $\mathbf{6}_{FL}$, $\mathbf{6}_{FR}$, $\mathbf{6}_C$, $\mathbf{6}_{RL}$, $\mathbf{6}_{RR}$, $\mathbf{6}_{WF}$ by supplying the analog audio signals $SP_{FL}$, $SP_{FR}$, $SP_C$, $SP_{RL}$, $SP_{RR}$, $SP_{WF}$, whose frequency characteristic and phase characteristic are corrected, to these loudspeakers.

The signal processing circuit 2 is composed of a digital signal processor (DSP), or the like. The automatic sound field correcting system consists of the digital signal processor (DSP), etc., that cooperate with the noise generator 3, the amplifier 9, and the A/D converter 10 to execute the sound field correction.

More particularly, system circuits $CQT_1$, $CQT_2$, $CQT_3$, $CQT_4$, $CQT_5$, $CQT_k$ which are provided to signal transmission lines on respective channels shown in FIG. 2 to have the almost similar configuration, a frequency characteristic correcting portion 11, a channel-to-channel level correcting portion 12, a phase characteristic correcting portion 13, and a flatness correcting portion 14 shown in FIG. 3 are provided to the signal processing circuit 2. Then, the automatic sound field correcting system is constructed such that the frequency characteristic correcting portion 11, the channel-to-channel level correcting portion 12, the phase characteristic correcting portion 13, and the flatness correcting portion 14 can control the system circuits $CQT_1$, $CQT_2$, $CQT_3$, $CQT_4$, $CQT_5$, $CQT_k$. In this case, in the following explanation, respective channels are denoted by numbers x ($1 \leqq x \leqq k$).

A configuration of the system circuit $CQT_1$ provided to the first channel (x=1) will be explained on behalf of the system circuits. Such configuration includes a switch element $SW_{12}$ that ON/OFF-controls an input of the digital audio signal $S_{FL}$ from the sound source 1 and a switch element $SW_{11}$ that ON/OFF-controls an input of a noise signal DN from the noise generator 3. Also, the switch element $SW_{11}$ is connected to the noise generator 3 via a switch element $SW_N$.

The switch elements $SW_{11}$, $SW_{12}$, $SW_N$ are controlled by a system controller MPU that consists of a microprocessor described later. At the time of reproducing the audio sound, the switch element $SW_{12}$ is turned ON (conductive) and the switch elements $SW_{11}$, $SW_N$ are turned OFF (nonconductive). At the time of correcting the sound field, the switch element $SW_{12}$ is turned OFF and the switch elements $SW_{11}$, $SW_N$ are turned ON.

Band-pass filters $BPF_{11}$ to $BPF_{1j}$ are connected in parallel to output contacts of the switch elements $SW_{11}$, $SW_{12}$ as frequency discriminating means, and thus the frequency dividing means that divides the frequency of the input signal is constructed by the overall band-pass filters $BPF_{11}$ to $BPF_{1j}$. In this case, suffixes 11 to 1j attached to $BPF_{11}$ to $BPF_{1j}$ denote the order of center frequencies f1 to fj of the band-pass filters $BPF_{11}$ to $BPF_{1j}$ on the first channel (x=1).

Attenuators $ATF_{11}$ to $ATF_{1j}$ being called an inter-band attenuator are connected to output contacts between the band-pass filters $BPF_{11}$ to $BPF_{1j}$ respectively. Accordingly, the attenuators $ATF_{11}$ to $ATF_{1j}$, act as an in-channel level adjusting means that adjusts respective output levels of the band-pass filters $BPF_{11}$to $BPF_{1j}$.

Also, an adder $ADD_1$ is connected to output contacts of the inter-band attenuators $ATF_{11}$ to $ATF_{1j}$, an attenuator $ATG_1$ being called a channel-to-channel attenuator is connected to an output contact of the adder $ADD_1$, and a delay circuit $DLY_1$ is connected to an output contact of the channel-to-channel attenuator $ATG_1$. Then, an output $D_{FL}$ of the delay circuit $DLY_1$ is supplied to the D/A converter $\mathbf{4}_{FL}$ shown in FIG. 1.

Figure 5:
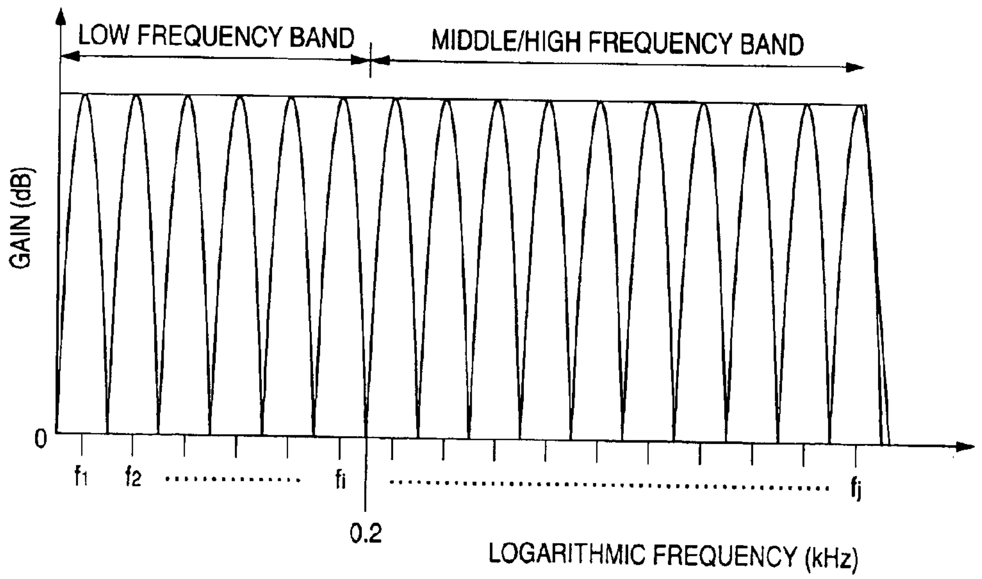
FIG. 5 is a view showing a frequency characteristic of a band-pass filter.

Then, as shown in the frequency characteristic diagram of FIG. 5, the band-pass filters $BPF_{11}$ to $BPF_{1j}$ are formed by narrow band passing type secondary Butterworth filters whose center frequencies are set to f1, f2, . . . fi, . . . fj respectively.

In other words, the band-pass filters $BPF_{11}$ to $BPF_{ij}$ that have frequencies f1, f2, . . . fi, . . . fj as center frequencies respectively are provided. Such frequencies f1, f2, . . . fi, . . . fj are previously decided by dividing all frequency band of the loudspeaker $\mathbf{6}_{FL}$, that can reproduce over the low frequency band to the middle/high frequency band, by any number j. More particularly, the low frequency band that is less than about 0.2 kHz is divided into about six ranges and also the middle/high frequency band that is more than about 0.2 kHz is divided into about seven ranges, and then the center frequencies of respective divided narrow frequency ranges are set as the center frequencies f1, f2, . . . fi, . . . fj of the band-pass filters $BPF_{11}$, to $BPF_{1j}$. In addition, all frequency bands are covered without omission by setting the center frequencies not to form clearances between respective passing frequency bands of the band-pass filters $BFP_{11}$ to $BPF_{1j}$ and not to overlap substantially respective passing frequency bands.

Also, exclusive ON/OFF switching of the band-pass filters $BPF_{11}$ to $BPF_{1j}$ can be performed mutually under the control of the system controller MPU. Also, in reproducing the audio sound, all band-pass filters $BFP_{11}$ to $BPF_{1j}$ are switched into their conductive states.

The attenuators $ATF_{11}$ to $ATF_{1j}$ consist of a digital attenuator respectively, and changes their attenuation factors in the range of 0 dB to the (–) side in accordance with adjust signals $SF_{11}$ to $SF_{1j}$ supplied from the frequency characteristic correcting portion 11.

The adder ADD1 adds signals that are passed through the band-pass filters $BPF_{11}$ to $BPF_{1j}$ and attenuated by the attenuators $ATF_{11}$ to $ATF_{1j}$ and then supplies the added signal to the attenuator $ATG_1$.

The channel-to-channel attenuator $ATG_1$ consists of the digital attenuator. Although its details will be given in the explanation of operation, the channel-to-channel attenuator $ATG_1$ changes its attenuation factor in the range of 0 dB to the (–) side in compliance with the adjust signal $SG_1$ from the channel-to-channel level correcting portion 12.

The delay circuit $DLY_1$ consists of the digital delay circuit, and changes its delay time in compliance with the adjust signal $SDL_1$ supplied from the phase characteristic correcting portion 13.

Then, the system circuits $CQT_2$, $CQT_3$, $CQT_4$, $CQT_5$ on remaining channels x=2 to 5 have a similar configuration to the system circuit $CQT_1$.

More particularly, although shown simply in FIG. 2, following to the switch elements $SW_{21}$, $SW_{22}$, j band-pass filters $BPF_{21}$ to $BPF_{2j}$ that are set to the above center frequencies f1 to fj, inter-band attenuators $ATF_{21}$to $ATF_{2j}$ for changing their attenuation factors in the range of 0 dB to the (–) side in compliance with adjust signals $SF_{21}$ to $SF_{2j}$ supplied from the frequency characteristic correcting portion 11, an adder $ADD_2$, an channel-to-channel attenuator $ATG_2$ for changing its attenuation factor in the range of 0 dB to the (–) side in compliance with an adjust signal $SG_2$ supplied from the channel-to-channel level correcting portion 12, and a delay circuit $DLY_2$ for changing its delay time in compliance with an adjust signal $SDL_2$ supplied from the phase characteristic correcting portion 13 are provided to the system circuits $CQT_2$ on the second channel (x=2).

Following to the switch elements $SW_{31}$, $SW_{32}$, j band-pass filters $BPF_{31}$ to $BPF_{3j}$ that are set to the above center frequencies f1 to fj, inter-band attenuators $ATF_{31}$ to $ATF_{3j}$ an adder $ADD_3$, an channel-to-channel attenuator $ATG_3$, and a delay circuit $DLY_3$ are provided to the system circuits $CQT_3$ on the third channel (x=3). Then, like the system circuit $CQT_1$, the inter-band attenuators $ATF_{31}$ to $ATF_{3j}$ the channel-to-channel attenuator $ATG_3$, and the delay circuit $DLY_3$ are adjusted respectively in compliance with adjust signals $SF_{31}$ to $SF_{3j}$ supplied from the frequency characteristic correcting portion 11, an adjust signal $SG_3$supplied from the channel-to-channel level correcting portion 12, and an adjust signal $SDL_3$ supplied from the phase characteristic correcting portion 13.

Following to the switch elements $SW_{41}$, $SW_{42}$, j band-pass filters $BPF_{41}$to $BPF_{4j}$ that are set to the above center frequencies f1 to fj, inter-band attenuators $ATF_{41}$ to $ATF_{4j}$ an adder $ADD_4$, an channel-to-channel attenuator $ATG_4$, and a delay circuit $DLY_4$ are provided to the system circuits $CQT_4$ on the fourth channel (x=4). Then, like the system circuit $CQT_1$, the inter-band attenuators $ATF_{41}$ to $ATF_{4j}$, the channel-to-channel attenuator $ATG_4$, and the delay circuit $DLY_4$ are adjusted respectively in compliance with adjust signals $SF_{41}$ to $SF_{4j}$ supplied from the frequency characteristic correcting portion 11, an adjust signal $SG_4$ supplied from the channel-to-channel level correcting portion 12, and an adjust signal $SDL_4$ supplied from the phase characteristic correcting portion 13.

Following to the switch elements $SW_{51}$, $SW_{52}$, j band-pass filters $BPF_{51}$ to $BPF_{5j}$ that are set to the above center frequencies f1 to fj, inter-band attenuators $ATF_{51}$ to $ATF_{5j}$, an adder $ADD_5$, an channel-to-channel attenuator $ATG_5$, and a delay circuit $DLY_5$ are provided to the system circuits $CQT_5$ on the fifth channel (x=5). Then, like the system circuit $CQT_1$, the inter-band attenuators $ATF_{51}$ to $ATF_{5j}$, the channel-to-channel attenuator $ATG_5$, and the delay circuit $DLY_5$ are adjusted respectively in compliance with adjust signals $SF_{51}$ to $SF_{5j}$ supplied from the frequency characteristic correcting portion 11, an adjust signal $SG_5$supplied from the channel-to-channel level correcting portion 12, and an adjust signal $SDL_5$ supplied from the phase characteristic correcting portion 13.

However, the system circuit CQTk on the sixth subwoofer channel (x=k) is constructed such taht i (i<j) band-pass filters $BPF_{k1}$ to $BPF_{kj}$, that pass only divided low frequency bands (frequencies below about 0.2 kHz) shown in FIG. 5 respectively, and inter-band attenuators $ATF_{k1}$ to $ATF_{kj}$ are connected in parallel following to the switch elements $SW_{k1}$, $SW_{k2}$, then an adder $ADD_k$ adds outputs of the attenuators $ATF_{k1}$ to $ATF_{ki}$, then an output of the added result is passed through a channel-to-channel attenuator $ATG_k$ and a delay circuit $DLY_k$, and then an output $D_{WF}$ of the delay circuit $DLY_k$ is supplied to the D/A converter $\mathbf{4}_{WF}$.

Next, in FIG. 3, the frequency characteristic correcting portion 11 receives respective sound collecting data DM obtained when the loudspeakers $\mathbf{6}_{FL}$, $\mathbf{6}_{FR}$, $\mathbf{6}_{C}$, $\mathbf{6}_{RL}$, $\mathbf{6}_{RR}$, $\mathbf{6}_{WF}$ are sounded individually by the noise signal (pink noise) DN output from the noise generator 3, and then calculates levels of the reproduced sounds of respective loudspeakers at the listening position RV based on the sound collecting data DM. Then, the frequency characteristic correcting portion 11 generates the adjust signals $SF_{11}$ to $SF_{1j}$, $SF_{21}$ to $SF_{2j}$, . . . , $SF_{k1}$ to $SF_{ki}$ based on these calculated results to correct automatically the attenuation factors of the inter-band attenuators $ATF_{11}$ to $ATF_{1j}$, $ATF_{21}$ to $ATF_{2j}$, . . . , $ATF_{k1}$ to $ATF_{ki}$ individually.

Based on the above correction of the attenuation factors by the frequency characteristic correcting portion 11, gain adjustment for respective passing frequencies of the band-pass filters $BFP_{11}$ to $BPF_{ki}$ provided to the system circuits $CQT_1$ to $CQT_k$ is carried out every channel.

That is, the frequency characteristic correcting portion 11 adjusts the levels of respective signals output from the band-pass filters $BFP_{11}$ to $BPF_{ki}$ by performing the gain adjustment of the inter-band attenuators $ATF_{11}$ to $ATF_{ki}$ serving as an in-channel level adjusting means, whereby the frequency characteristic correcting portion 11 acts as an in-channel level correcting means for setting the frequency characteristic.

The channel-to-channel level correcting portion 12 receives respective sound collecting data DM obtained when all frequency band loudspeakers $\mathbf{6}_{FL}$, $\mathbf{6}_{FR}$, $\mathbf{6}_{C}$, $\mathbf{6}_{RL}$, $\mathbf{6}_{RR}$ are sounded individually by the noise signal (pink noise) DN output from the noise generator 3, and then calculates the levels of the reproduced sounds of respective loudspeakers at the listening position RV based on the sound collecting data DM. Then, the channel-to-channel level correcting portion 12 generates the adjust signals $SG_1$ to $SG_5$ based on these calculated results and corrects automatically the attenuation factors of the channel-to-channel attenuators $ATG_1$ to $ATG_5$by the adjust signals $SG_1$ to $SG_5$.

Based on the correction of the attenuation factors by the channel-to-channel level correcting portion 12, the level adjustment (gain adjustment) between the system circuits $CQT_1$ to $CQT_5$ on the first to fifth channels is carried out.

That is, the channel-to-channel level correcting portion 12 acts as a channel-to-channel level correcting means that corrects levels of the audio signals transmitted every channel (signal transmission line) between channels.

However, the channel-to-channel level correcting portion 12 does not adjust the attenuation factor of the channel-to-channel attenuator $ATG_k$ provided to the system circuit $CQT_k$ on the subwoofer channel, but the flatness correcting portion 14 adjusts the attenuation factor of the channel-to-channel attenuator $ATG_k$.

The phase characteristic correcting portion 13 measures the phase characteristic of respective channels based on respective sound collecting data DM obtained when respective loudspeakers $\mathbf{6}_{FL}$, $\mathbf{6}_{FR}$, $\mathbf{6}_{C}$, $\mathbf{6}_{RL}$, $\mathbf{6}_{RR}$, $\mathbf{6}_{WF}$ are sounded individually by supplying the noise signal (uncorrelated noise) DN output from the noise generator 3 to the system circuits $CQT_1$ to $CQT_k$ on respective channels, and then corrects the phase characteristic of the sound field space in compliance with the measured result.

More particularly, the loudspeakers $\mathbf{6}_{FL}$, $\mathbf{6}_{FR}$, $\mathbf{6}_{C}$, $\mathbf{6}_{RL}$, $\mathbf{6}_{RR}$, $\mathbf{6}_{WF}$ on respective channels are sounded by the noise signal DN every period T, and then cross correlations between resultant sound collecting data $DM_1$, $DM_2$, $DM_3$, $DM_4$, $DM_5$, $DM_k$ on respective channels are calculated. Here, the cross correlation between the sound collecting data $DM_2$ and $DM_1$, the cross correlation between the sound collecting data $DM_3$ and $DM_1$, . . . the cross correlation between the sound collecting data $DM_k$ and $DM_1$ are calculated, and then peak intervals (phase differences) between respective correlation values are set as their delay times τ2 to τk in respective system circuits $CQT_2$ to $CQT_k$. That is, the delay times τ2 to τk of remaining system circuits $CQT_2$ to $CQT_k$ are calculated on the basis of the phase of the sound collecting data DM1 obtained from the system circuit $CQT_1$ (i.e., phase difference 0, τ1=0) . Then, the adjust signals $SDL_1$ to $SDL_k$ are generated based on measured results of these delay times τ2 to τk, and then the phase characteristic of the sound field space is corrected by automatically adjusting respective delay times of the delay circuits $DLY_1$ to $DLY_k$ by using these adjust signals $SDL_1$ to $SDL_k$. In this case, the pink noise is employed to correct the phase characteristic in the present embodiment, but the present invention is not limited to this noise and other noises may be employed.

The flatness correcting portion 14 adjusts the attenuation factor of the channel-to-channel attenuator $ATG_k$ in the system circuit $CQT_k$, that is not adjusted by the channel-to-channel level correcting portion 12 after the adjustments made by the frequency characteristic correcting portion 11, the channel-to-channel level correcting portion 12, and the phase characteristic correcting portion 13 have been completed.

That is, as shown in FIG. 4, the flatness correcting portion 14 comprises a middle/high frequency band processing portion 15*a*, a low frequency band processing portion 15*b*, a subwoofer low frequency band processing portion 15*c*, and a calculating portion 15*d*.

In the state that the low frequency band-pass filters $BPF_{11}$ to $BPF_{1i}$ $BPF_{2i}$ to $BPF_{2i}$, $BPF_{31}$ to $BPF_{3i}$, $BPF_{41}$ to $BPF_{4i}$, $BPF_{51}$ to $BPF_{5i}$ provided to the system circuits CQT1 to CQT5 are turned OFF and the remaining middle/high frequency band-pass filters are turned ON, the middle/high frequency band processing portion 15*a* measures a spectrum average level $P_{MH}$ of the reproduced sound in the middle/high frequency band from the sound collecting data DM (referred to as "middle/high frequency band sound collecting data $D_{MH}$" hereinafter) that are obtained when all frequency band loudspeakers $\mathbf{6}_{FL}$, $\mathbf{6}_{FR}$, $\mathbf{6}_{C}$, $\mathbf{6}_{RL}$, $\mathbf{6}_{RR}$ are sounded simultaneously based on the noise signal (uncorrelated noise) DN output from the noise generator 3.

In the state that the low frequency band-pass filters $BPF_{11}$ to $BPF_{1j}$, $BPF_{21}$ to $BPF_{2i}$, $BPF_{31}$ to $BPF_{3i}$, $BPF_{41}$ to $BPF_{4i}$, $BPF_{51}$, to $BPF_{5i}$ provided to the system circuits $CQT_1$, to $CQT_5$ are turned ON and the remaining middle/high frequency band-pass filters are turned OFF, the low frequency band processing portion 15*b* measures a spectrum average level $P_L$ of the reproduced sound in the low frequency band from the sound collecting data DM (referred to as "low frequency band sound collecting data $D_L$" hereinafter) that are obtained when all frequency band loudspeakers $6_{FL}$, $6_{FR}$, $6_C$, $6_{RL}$, $6_{RR}$ are sounded simultaneously based on the noise signal (uncorrelated noise) DN output from the noise generator 3.

In the condition that all band-pass filters $BPF_{k1}$ to $BPF_{ki}$ provided to the system circuit $CQT_k$ on the subwoofer channel are turned ON, the low frequency band processing portion 15*c* measures a spectrum average level $P_{WFL}$ of the low sound reproduced only by the loudspeaker $6_{WF}$ from the sound collecting data DM (referred to as "subwoofer sound collecting data $D_{WFL}$" hereinafter) that are obtained when the low frequency exclusively reproducing loudspeaker $6_{WF}$ is sounded based on the noise signal (pink noise) DN output from the noise generator 3.

The calculating portion 15*d* generates the adjust signal $SG_k$ that makes the frequency characteristic of the reproduced sound at the listening position RV flat over all audio frequency bands when all loudspeakers $6_{FL}$, $6_{FR}$, $6_C$, $6_{RL}$, $6_{RR}$, $6_{WF}$ are sounded simultaneously, by executing predetermined calculating processes explained later in detail based on the spectrum average level $P_{MH}$ in the above middle/high frequency band and the spectrum average levels $P_L$, $P_{WFL}$ in the low frequency bands.

Figure 6:
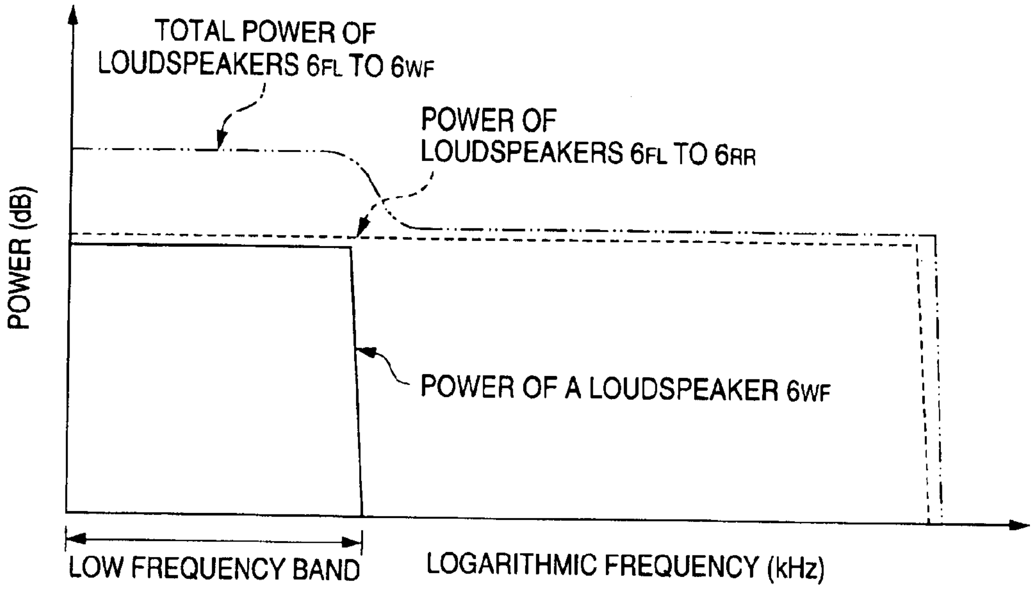
FIG. 6 is a view showing the problem in a low frequency band of a reproduced sound.

That is, as shown in the frequency characteristic diagram of FIG. 6, since the all frequency band loudspeakers $6_{FL}$, $6_{FR}$ $6_C$, $6_{RL}$, $6_{RR}$ have not only the middle/high frequency band reproducing capability but also the low frequency band reproducing capability, in some cases the levels of the low frequency sounds reproduced by the loudspeakers $6_{FL}$, $6_{FR}$, $6_C$, $6_{RL}$, $6_{RR}$ and the low frequency sound reproduced by the loudspeaker $6_{WF}$, for example, become higher than the level of the reproduced sound in the middle/high frequency band if these loudspeakers $6_{FL}$, $6_{FR}$, $6_C$, $6_{RL}$, $6_{RR}$ and the low frequency band exclusively reproducing loudspeaker $6_{WF}$ are sounded. Thus, there is caused such a problem that such low frequency sounds are offensive to the ear and also give the listener an unpleasant feeling. Therefore, the calculating portion 15*d* adjusts the attenuation factor of the channel-to-channel attenuator $ATG_k$ by the adjust signal $SG_k$ such that the levels of the above low frequency sounds and the levels of the middle/high frequency sounds can be made flat.

Accordingly, the flatness correcting portion 14 as well as the channel-to-channel level correcting portion 12 acts as the channel-to-channel level correcting means that corrects the levels of the audio signals transmitted every channel (signal transmission line) between the channels.

In this case, the configuration of the automatic sound field correcting system is explained, but more detailed functions will be explained in detail in the explanation of operation.

Next, an operation of the automatic sound field correcting system having such configuration will be explained with reference to flowcharts shown in FIG. 8 to FIG. 12 hereunder.

When the listener arranges a plurality of loudspeakers $6_{FL}$ to $6_{WF}$ in the listening room 7, etc. and connects them to the present audio system, as shown in FIG. 7, for example, and then instructs to start the sound field correction by operating a remote controller (not shown) provided to the present audio system, the system controller MPU operates the automatic sound field correcting system in compliance with this instruction.

First, an outline of the operation of the automatic sound field correcting system will be explained with reference to FIG. 8. In the frequency characteristic correcting process in step S10, the process for adjusting the attenuation factors of all inter-band attenuators $ATF_{11}$ to $ATF_{kj}$ provided to the system circuits $CQT_1$, $CQT_2$, $CQT_3$, $CQT_4$, $CQT_5$, $CQT_k$ is carried out by the frequency characteristic correcting portion 11.

Then, in the channel-to-channel level correcting process in step S20, the process for adjusting the attenuation factors of the channel-to-channel attenuators $ATG_1$ to $ATG_5$ provided to the system circuits $CQT_1$, $CQT_2$, $CQT_3$, $CQT_4$, $CQT_5$ is carried out by the channel-to-channel level correcting portion 12. That is, in step S20, the channel-to-channel attenuator $ATG_k$ provided to the system circuit $CQT_k$ on the subwoofer channel is not adjusted.

Then, in the phase characteristic correcting process in step S30, the process for adjusting the delay times of all delay circuits $DLY_1$ to $DLY_k$ provided to the system circuits $CQT_1$, $CQT_2$, $CQT_3$, $CQT_4$, $CQT_5$, $CQT_k$ is carried out by the phase characteristic correcting portion 13. That is, the process for correcting the phase characteristic of the reproduced sound being reproduced by all loudspeakers $6_{FL}$ to $6_{WF}$ is performed.

Then, in the flatness correcting process in step S40, the process for making the frequency characteristic of the reproduced sound at the listening position RV flat over the full audio frequency band is carried out by the flatness correcting portion 14.

In this manner, the present automatic sound field correcting system executes the sound field correction by performing in sequence the correcting processes that are roughly classified into four stages.

Then, respective processes in steps S10 to S40 will be explained in sequence.

First, the frequency characteristic correcting process in step S10 will be explained in detail. The process in step S10 will be carried out in compliance with the detailed flowchart shown in FIG. 9.

In step S100, the initialization process is executed to set the attenuation factors of all inter-band attenuators $ATF_{11}$ to $ATF_{ki}$ and the channel-to-channel attenuators $ATG_1$ to $ATG_k$ in the system circuits $CQT_1$, $CQT_2$, $CQT_3$, $CQT_4$, $CQT_5$, $CQT_k$ shown in FIG. 2 to 0 dB. Also, the delay times in all delay circuits $DLY_1$ to $DLY_k$ are set to 0, and the amplification factors of the amplifiers $5_{FL}$ to $5_{WF}$ shown in FIG. 1 are set equal.

In addition, the switch elements $SW_{12}$, $SW_{22}$, $SW_{32}$, $SW_{42}$, $SW_{52}$, $SW_{k2}$ are turned OFF (nonconductive) to cut off the input from the sound source 1, and the switch elements $SW_N$ is turned ON (conductive). Accordingly, the signal processing circuit 2 is set to the state that the noise signal (pink noise) DN generated by the noise generator 3 is supplied to the system circuits $CQT_1$, $CQT_2$, $CQT_3$, $CQT_4$, $CQT_5$, $CQT_k$.

Then, the process goes to step S102, flag data n=0 is set in a flag register (not shown) built in the system controller MPU.

Then, the sound field characteristic measuring process is executed in step S104.

In this step S104, the noise signal DN is supplied in sequence to the system circuits $CQT_1$, to $CQT_k$ by exclusively turning ON the switch elements $SW_{11}$, $SW_{21}$, $SW_{31}$, $SW_{41}$, $SW_{51}$, $SW_{k1}$ for the predetermined period T respectively. Also, the band-pass filters in the system circuit to which the noise signal DN is being supplied are exclusively turned ON in sequence from the low frequency band side to the middle/high frequency band side.

Accordingly, the noise signal DN that is frequency-divided by the band-pass filters $BFP_{11}$ to $BPF_{1j}$ in the system circuit $CQT_1$ is supplied to the loudspeaker $6_{FL}$ sequentially. As a result, the microphone 8 collects the noise sound that is produced at the listening position RV and is frequency-divided, and the D/A converter 10 supplies these sound collecting data DM (referred to as "$DM_{11}$ to $DM_{1j}$" hereinafter) to the frequency characteristic correcting portion 11. Then, the frequency characteristic correcting portion 11 stores these sound collecting data $DM_{11}$ to $DM_{1j}$ in a predetermined memory portion (not shown).

Also, similarly the noise signal DN that is subjected to the frequency division is supplied to the loudspeakers $6_{FR}$ to $6_{WF}$ via remaining system circuits $CQT_2$ to $CQT_k$, and then resultant sound collecting data DM (referred to as "$DM_{21}$ to $DM_{2j}$, $DM_{31}$ to $DM_{3j}$, $DM_{41}$ to $DM_{4j}$, $DM_{51}$ to $DM_{5j}$, $DM_{k1}$ to $DM_{ki}$" hereinafter) on respective channels are stored in the predetermined memory portion (not shown).

In this manner, the sound collecting data [DAxJ] expressed by a matrix in Eq. (1) are stored in the frequency characteristic correcting portion 11 by executing the sound field characteristic measuring process. In this case, a suffix x in [DAxJ] denotes the channel number (1≦x≦k), and a suffix J denotes the order of the center frequencies f1 to fj from the low frequency band to the middle/high frequency band.

$$[DAxJ] = \begin{pmatrix} DM11 & \cdots & \cdots & DM1j \\ DM21 & \cdots & \cdots & DM2j \\ DM31 & \cdots & \cdots & DM3j \\ DM41 & \cdots & \cdots & DM4j \\ DM51 & \cdots & \cdots & DM5j \\ DMk1 & \cdots & DMki & \end{pmatrix} \tag{1}$$

In addition, in step S104, the sound collecting data [DAxJ] are compared with predetermined threshold value $THD_{CH}$ every channel, and sizes of the loudspeakers $6_{FL}$ to $6_{WF}$ on respective channels are decided based on the comparison results. That is, since the sound pressure of the reproduced sound reproduced by the loudspeaker is changed according to the size of the loudspeaker, the sizes of the loudspeakers on respective channels are decided.

As the concrete deciding means, if the size of the loudspeaker $6_{FL}$ on the first channel (x=1) is decided, an average value of the sound collecting data $DM_{11}$ to $DM_{1j}$ on the first channel in above Eq. (1) is compared with the threshold value $THD_{CH}$. If the average value is smaller than the threshold value $THD_{CH}$, the loudspeaker $6_{FL}$ is decided as the small loudspeaker. Then, if the average value is larger than the threshold value $THD_{CH}$, the loudspeaker $6_{FL}$ is decided as the large loudspeaker. In addition, the loudspeakers $6_{FR}$, $6_C$, $6_{RL}$, $6_{RR}$, $6_{WF}$ on remaining channels are similarly decided.

Then, in the channels in which the loudspeakers being decided as the small loudspeaker are connected, processes in steps S106 to S124 described in the following are not executed. The processes in steps S106 to S124 are applied only to the channels in which the loudspeakers being decided as the large loudspeaker are connected.

In order to facilitate the understanding of explanation, the processes in steps S106 to S124 will be explained under the assumption that all the loudspeakers $6_{FL}$, $6_{FR}$, $6_C$, $6_{RL}$, $6_{RR}$, $6_{WF}$ are the large loudspeaker.

Then, in step S106, the listener sets target curve data [TGxJ] that are set previously in the present audio system into the frequency characteristic correcting portion 11. Where the target curve denotes the frequency characteristic of the reproduced sound that can suit the listener's taste. In the present audio system, in addition to the target curve used to generate the reproduced sound having the frequency characteristic that is suitable for the classic music, various target curve data [TGxJ] used to generate the reproduced sounds having the frequency characteristics that are suitable for rock music, pops, vocal, etc. are stored in the system controller MPU. Also, these target curve data [TGxJ] consist of an aggregation of the data of the same number as the inter-band attenuators $ATF_{11}$ to $ATF_{ki}$, as shown by a matrix in Eq. (2), and they can be selected every channel independently.

$$[TGxJ] = \begin{pmatrix} TG11 & \cdots & \cdots & TG1j \\ TG21 & \cdots & \cdots & TG2j \\ TG31 & \cdots & \cdots & TG3j \\ TG41 & \cdots & \cdots & TG4j \\ TG51 & \cdots & \cdots & TG5j \\ TGk1 & \cdots & TGki & \end{pmatrix} \tag{2}$$

Then, the listener can select these target curves freely by operating predetermined operation buttons of a remote controller. Then, the system controller MPU sets the selected target curve data [TGxJ] onto the frequency characteristic correcting portion 11.

However, if the listener instructs the sound field correction without selection of the target curve, all data $TG_{11}$ to $TG_{ki}$ are set to a previously decided value, e.g., 1.

Then, in step S108, the frequency characteristic correcting portion 11 sets the number of the first channel (x=1) and the order of the first center frequency (J=1), and then calculates the adjust values F0(1,1) to F0(1,j) by repeating processes in steps S110 to S114 to adjust the inter-band attenuators $ATF_{11}$ to $ATF_{1j}$.

More particularly, if the first line data $DM_1$, to $DM_{1j}$ in the sound collecting data [DAxJ] given by above Eq. (1) and the first line data $TG_{11}$ to $TG_{1j}$ in the target curve data [TGAxJ] given by above Eq. (2) are applied to following Eq. (3) while changing the variable J between 1 to j in steps S112 and S114 after the flag data n is set to 0 and a variable x representing the channel is set to 1, the adjust values F0(1,1) to F0(1,j) of the inter-band attenuators $ATF_{11}$ to $ATF_{1j}$ corresponding to the first channel are calculated. However, if a value TGxJ/DMxJ calculated by Eq. (3) has a calculation error that is smaller than the predetermined threshold value THD, the value TGxJ/DMxJ is forcedly set to 0 to achieve the improvement in the adjust precision.

$$Fn(x,J)=TGxJ/DMxJ \tag{3}$$

Then, in step S112, if it is decided that all adjusted values F0(1,1) to F0(1,j) of the inter-band attenuators $ATF_{11}$ to $ATF_{1j}$ on the first channel have been calculated, the process goes to step S116. Then, it is decided whether or not the adjusted values of all inter-band attenuators on the second to sixth channels (x=2 to k) have been calculated. If NO, the variable x is incremented by 1 and the variable j is set to 1 in step S118, and then the processes from step S110 to step S116 are repeated. Then, if the calculation of the adjusted values of all inter-band attenuators is finished, the process goes to step S120.

Accordingly, the adjusted values [F0xJ] of all inter-band attenuators ATF11 to ATF1j represented by the matrix given by following Eq. (4) are calculated.

$$[F0xJ] = \begin{pmatrix} F0(1,1) & \cdots & \cdots & F0(1,j) \\ F0(2,1) & \cdots & \cdots & F0(2,j) \\ F0(3,1) & \cdots & \cdots & F0(3,j) \\ F0(4,1) & \cdots & \cdots & F0(4,j) \\ F0(5,1) & \cdots & \cdots & F0(5,j) \\ F0(k,1) & \cdots & F0(k,i) & \end{pmatrix} \quad (4)$$

Then, in step S120, the adjusted values [F0xJ] are normalized by executing the calculation represented by the matrix in following Eq. (5), and then resultant normalized adjusted values [FN0xJ] are set as new target curve data [TGxJ]=[FN0xJ] . That is, the target curve data [TGxJ] in above Eq. (2) are replaced with the normalized adjusted values [FN0xJ].

$$[FN0xJ] = \begin{pmatrix} F0(1,1)/F01\text{max} & \cdots & \cdots & F0(1,j)/F01\text{max} \\ F0(2,1)/F02\text{max} & \cdots & \cdots & F0(2,j)/F02\text{max} \\ F0(3,1)/F03\text{max} & \cdots & \cdots & F0(3,j)/F03\text{max} \\ F0(4,1)/F04\text{max} & \cdots & \cdots & F0(4,j)/F04\text{max} \\ F0(5,1)/F05\text{max} & \cdots & \cdots & F0(5,j)/F05\text{max} \\ F0(k,1)/F0k\text{max} & \cdots & F0(k,i)/F0k\text{max} & \end{pmatrix} \quad (5)$$

In this case, values F01max to F0kmax having a suffix “max” in Eq. (5) are maximum values of the adjusted values on respective channels x=1 to k when the flag data n is n=1.

Then, in step S122, it is decided whether or not the flag data n is 1. If NO, the flag data n is set to 1 in step S124, and then the processes from step S104 to S120 are repeated.

In this manner, the processes in step S104 and subsequent steps are repeated. In step S122, if it is decided that the flag data n is 1, the process goes to step S126. While, if the processes in step S104 and subsequent steps are repeated, the flag data n is set to n=1 and thus the calculations in above Eqs. (1) to (5) are executed once again. Thus, the normalized adjusted values [FN1xJ] in following Eq. (6) corresponding to above Eq. (5) are calculated.

$$[FN1xJ] = \begin{pmatrix} F1(1,1)/F11\text{max} & \cdots & \cdots & F1(1,j)/F11\text{max} \\ F1(2,1)/F12\text{max} & \cdots & \cdots & F1(2,j)/F12\text{max} \\ F1(3,1)/F13\text{max} & \cdots & \cdots & F1(3,j)/F13\text{max} \\ F1(4,1)/F14\text{max} & \cdots & \cdots & F1(4,j)/F14\text{max} \\ F1(5,1)/F15\text{max} & \cdots & \cdots & F1(5,j)/F15\text{max} \\ F1(k,1)/F1k\text{max} & \cdots & F1(k,i)/F1k\text{max} & \end{pmatrix} \quad (6)$$

Then, in step S126, adjust data [SFxJ] used to adjust the attenuation factors of all inter-band attenuators $ATF_{11}$ to $ATF_{1j}$, . . . , $ATF_{k1}$ to $ATF_{ki}$ of the system circuits $CQT_1$ to $CQT_k$ shown in Eq. (7) are calculated by multiplying the normalized adjusted values [FN0xJ] by the normalized adjusted values [FN1xJ] in respective matrices.

$$[SFxJ] = \begin{pmatrix} SF11 & \cdots & \cdots & SF1j \\ SF21 & \cdots & \cdots & SF2j \\ SF31 & \cdots & \cdots & SF3j \\ SF41 & \cdots & \cdots & SF4j \\ SF51 & \cdots & \cdots & SF5j \\ SFk1 & \cdots & SFki & \end{pmatrix} \quad (7)$$

That is, a value SF11 on the first row and the first column of the matrix in Eq. (7) is calculated by multiplying a value F0(1,1)/F01max on the first row and the first column of the normalized adjusted values [FN0xJ] and [FN1xJ] shown in Eqs. (5) (6) by a F1(1,1)/F11max, and then a value $SF_{21}$ on the second row and the first column of the matrix in Eq. (7) is calculated by multiplying a value F0(2,1)/F02max on the second row and the first column by a F1(2,1)/F12max. In the subsequent, adjust data [SFxj] used for the attenuation factor adjustment represented by the matrix in Eq. (7) are calculated by executing the similar calculation in the following.

Figure 8:
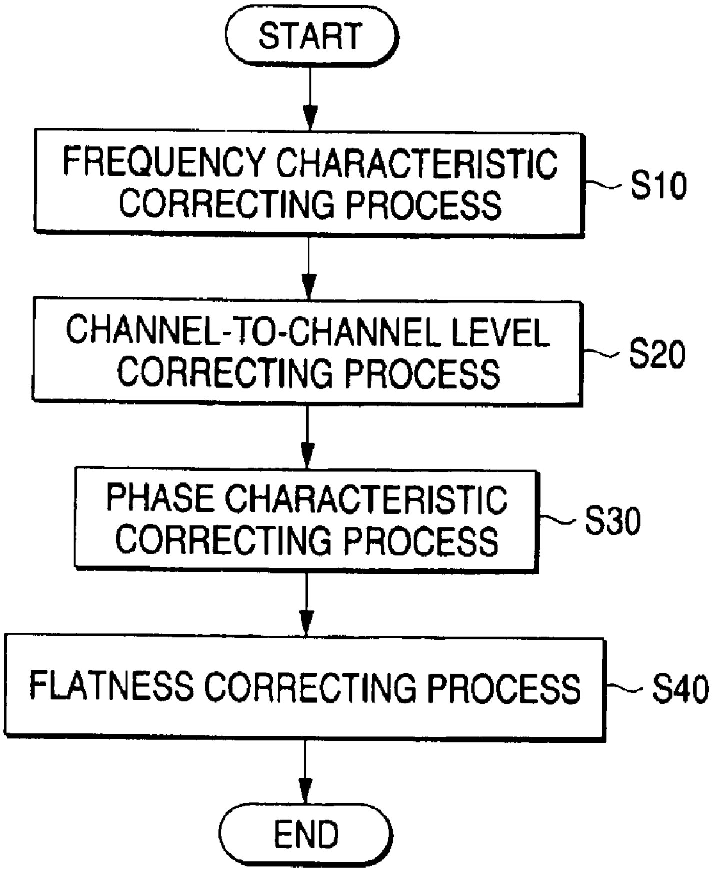
FIG. 8 is a flowchart showing an operation of the automatic sound field correcting system according to the present embodiment.
Figure 9:
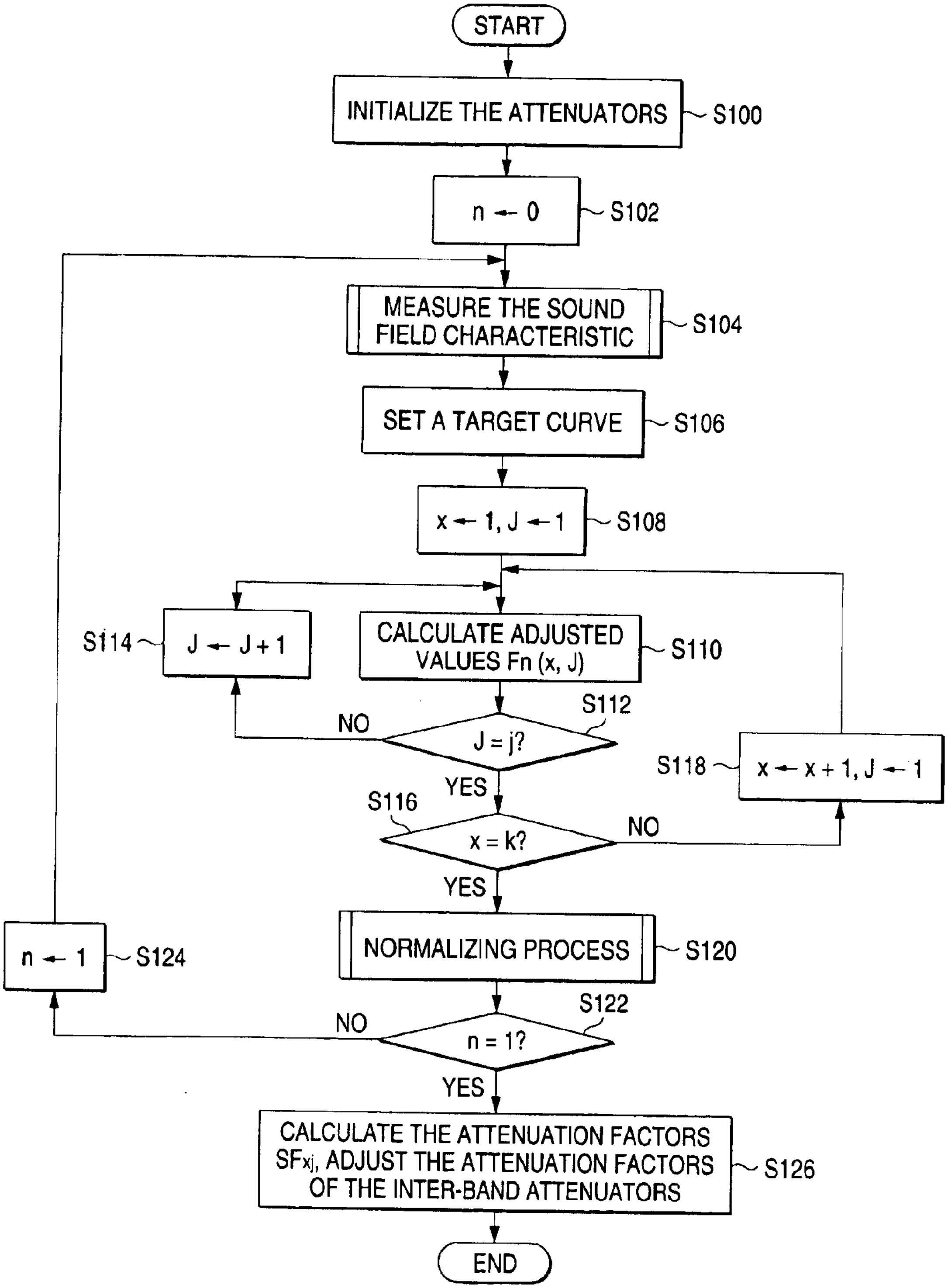
FIG. 9 is a flowchart showing a frequency characteristic correcting process.

Then, the attenuation factors if the inter-band attenuators $ATF_{11}$ to $ATF_{1j}$, . . . , $ATF_{k1}$ to $ATF_{ki}$ are adjusted according to respective adjust signals $SF_{11}$ to $SF_{1j}$, . . . , $SF_{k1}$ to $SF_{ki}$ based on the adjust data [SFxJ], and then the process goes to step S20 in FIG. 8.

Also, in the foregoing sound field characteristic measuring process in step S104, if the channel in which the small loudspeaker is connected is decided, the attenuation factors of the inter-band attenuators provided in the channels are adjusted to 0 dB, while the attenuation factors of the inter-band attenuators in the channels in which the large loudspeakers are connected are adjusted based on the adjust data [SFxJ].

In step S104, if it is decided that the loudspeakers $\mathbf{6}_{FL}$, $\mathbf{6}_{FR}$, $\mathbf{6}_{C}$, $\mathbf{6}_{RL}$, $\mathbf{6}_{RR}$, $\mathbf{6}_{WF}$ on all channels are all small loudspeakers, the process goes directly to the processes from step S104 to step S126 without executing steps S106 to S124. In step S126, the attenuation factors of the inter-band attenuators on all channels are adjusted to 0 dB.

In this way, the frequency characteristics of respective channels are corrected by adjusting the attenuation factors of the inter-band attenuators $ATF_{11}$ to $ATF_{ki}$ by virtue of the frequency characteristic correcting portion 11. Thus, the frequency characteristic of the sound field space is made proper.

Also, in the sound field characteristic measuring process in step S104, since respective loudspeakers $\mathbf{6}_{FL}$, $\mathbf{6}_{FR}$, $\mathbf{6}_{C}$, $\mathbf{6}_{RL}$, $\mathbf{6}_{RR}$, $\mathbf{6}_{WF}$ are sounded by the pink noise on time-division basis, the frequency characteristics and the reproducing capabilities of respective loudspeakers can be detected under the substantially same conditions when the sound field is produced based on the actual audio signals. Therefore, the total correction of the frequency characteristic can be achieved while taking account of the frequency characteristics and the reproducing capabilities of respective loudspeakers.

Figure 10:
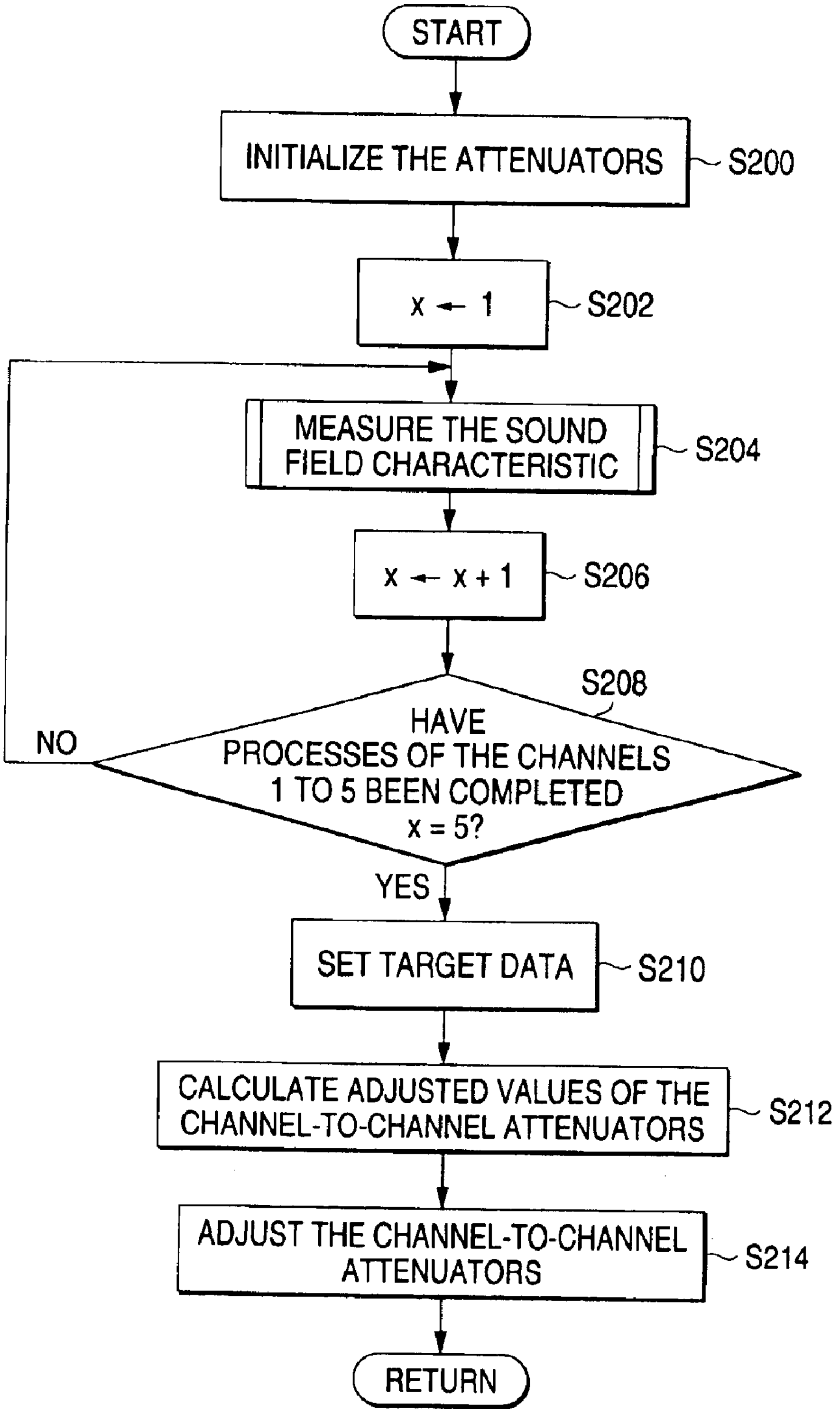
FIG. 10 is a flowchart showing a channel-to-channel level correcting process.

Next, the channel-to-channel level correcting process in step S20 will be carried out in compliance with a flowchart shown in FIG. 10.

First, the initialization process in step S200 is executed, and the noise signal DN from the noise generator 3 can be input by switching the switch elements $SW_{11}$ to $SW_{51}$. At this time, the switch elements $SW_{k1}$, $SW_{k2}$ on the subwoofer channel are turned OFF. Also, the attenuation factors of the channel-to-channel attenuators $ATG_1$ to $ATG_k$ are set to 0 dB. In addition, the delay times of all delay circuits $DLY_1$ to $DLY_5$ are set to 0. Further, the amplification factors of the amplifiers $\mathbf{5}_{FL}$ to $\mathbf{5}_{WF}$ shown in FIG. 1 are made equal.

Besides, the attenuation factors of the inter-band attenuators $ATF_{11}$ to $ATF_{1j}$, $ATF_{21}$ to $ATF_{2j}$, . . . , $ATF_{k1}$ to $ATF_{ki}$, are fixed to the state that they have been adjusted by the above frequency characteristic correcting process.

Then, in step S202, the variable x representing the channel number is set to 1. Then, in step S204, the sound field characteristic measuring process is executed. The processes in steps S204 to S208 are repeated until the sound field characteristic measurement of the channels 1 to 5 is completed.

Here, the noise signal (pinknoise) is supplied in sequence to the system circuits $CQT_1$ to $CQT_5$ by exclusively turning ON the switch elements $SW_{11}$, $SW_{21}$, $SW_{31}$, $SW_{41}$, $SW_{51}$, for the predetermined period T respectively while fixing the band-pass filters $BPF_{11}$ to $BPF_{1j}$, . . . , $BPF_{51}$ to $BPF_{5j}$ in the normal ON (conductive) state (steps S206, S208).

The microphone 8 collects respective reproduced sounds being reproduced by the loudspeakers $\mathbf{6}_{FL}$, $\mathbf{6}_{FR}$, $\mathbf{6}_{C}$, $\mathbf{6}_{RL}$, $\mathbf{6}_{RR}$ by this repeating process. Then, resultant sound collecting data DM (=$DM_1$ to $DM_5$) on the first to fifth channels are stored in the memory portion (not shown) in the channel-to-channel level correcting portion 12. That is, the sound collecting data [DBx] represented by the matrix in following Eq. (8) are stored.

$$[DBx] = \begin{pmatrix} DM1 \\ DM2 \\ DM3 \\ DM4 \\ DM5 \end{pmatrix} \tag{8}$$

Then, after the measurement of the sound field characteristics on the first to fifth channels has been finished, the process goes to step S210. Then, one sound collecting data having the minimum value is extracted from the sound collecting data $DM_1$ to $DM_5$. Then, the extracted data is set to the target data $TG_{CH}$ for the channel-to-channel level correction.

Then, in step S212, the attenuation factor adjusted values [SGx] of the channel-to-channel attenuators $ATG_1$ to $ATG_5$ given by following Eq. (9) are calculated by normalizing the matrix in above Eq. (8) based on the target data $TG_{CH}$ for the channel-to-channel level correction. Then, in step S214, the attenuation factors of the channel-to-channel attenuators $ATG_1$ to $ATG_5$ are adjusted by using the adjust signals $SG_1$ to $SG_5$ based on the attenuation factor adjust signals [SGx].

$$[SGx] = \begin{pmatrix} SG1 \\ SG2 \\ SG3 \\ SG4 \\ SG5 \end{pmatrix} = \begin{pmatrix} DM1/TGCH \\ DM2/TGCH \\ DM3/TGCH \\ DM4/TGCH \\ DM5/TGCH \end{pmatrix} \tag{9}$$

With the above processes, except the subwoofer channel, the level adjustment between the first to fifth channels in which all frequency band loudspeakers are connected is completed. Subsequently, the process goes to step S30 in FIG. 8.

In this fashion, the level characteristics of respective channels are made proper by correcting the attenuation factors of the channel-to-channel attenuators $ATG_1$ to $ATG_k$ by virtue of the channel-to-channel level correcting portion 12. Thus, the levels of the reproduced sounds of respective loudspeakers at the listening position RV are set properly.

Also, in the sound field characteristic measuring process in step S204, since resultant reproduced sounds are collected by sounding the loudspeakers $\mathbf{6}_{FL}$, $\mathbf{6}_{FR}$, $\mathbf{6}_{C}$, $\mathbf{6}_{RL}$, $\mathbf{6}_{RR}$ on time-division basis, the reproducing capabilities (output powers) of respective loudspeakers can be detected. Therefore, it is possible to achieve the total rationalization while taking account of the reproducing capabilities of respective loudspeakers.

Figure 11:
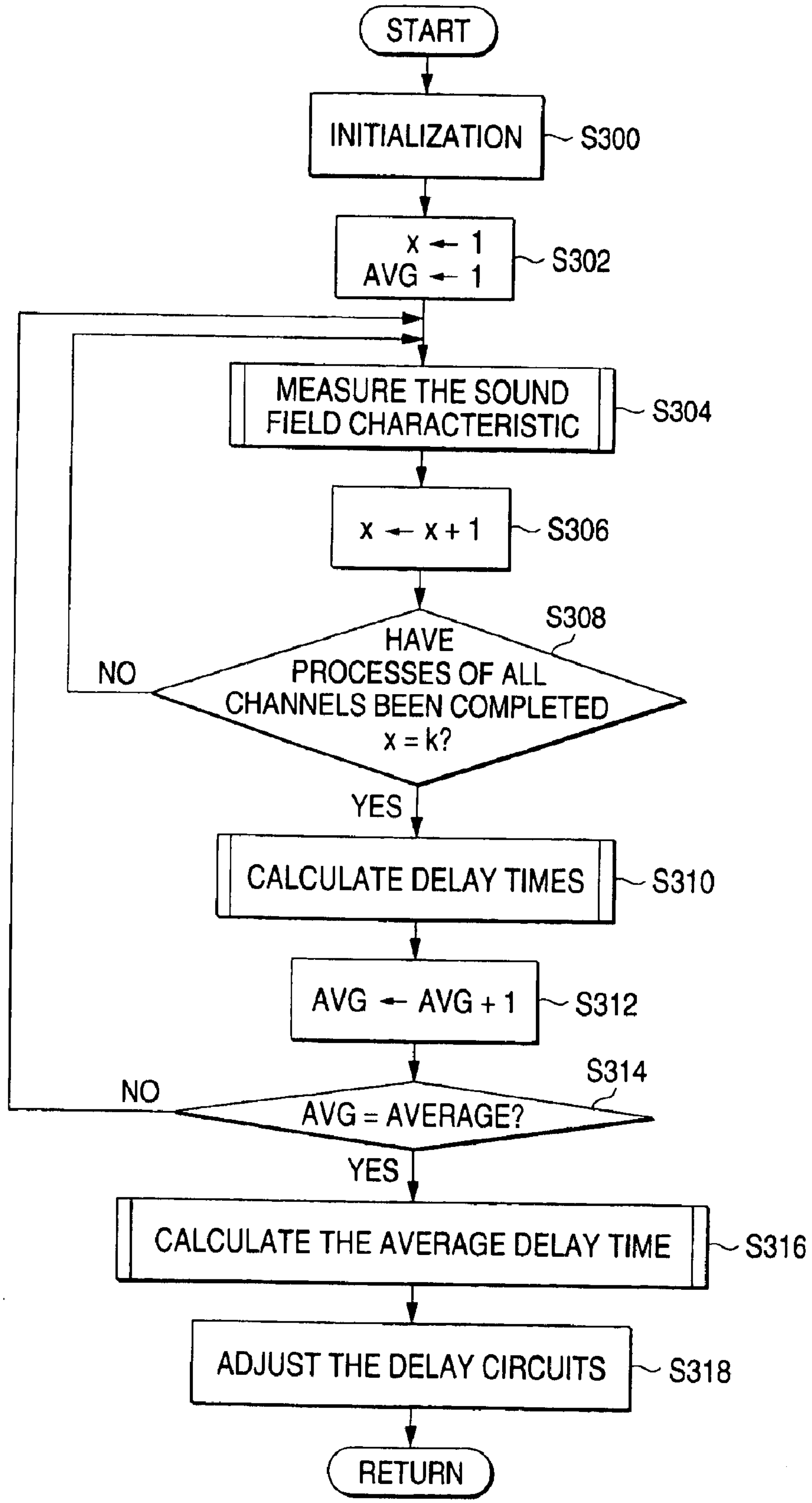
FIG. 11 is a flowchart showing a phase characteristic correcting process.

Next, the phase characteristic correcting process in step S30 will be carried out in compliance with a flowchart shown in FIG. 11.

First, the initialization process in step S300 is executed. The noise signal (uncorrelated noise) DN output from the noise generator 3 can be input by switching the switch elements $SW_{11}$ to $SW_{k2}$. Also, the inter-band attenuator $ATF_{11}$ to $ATF_{ki}$ and the channel-to-channel attenuators $ATG_1$ to $ATG_k$ are fixed to have the already-adjusted attenuation factors as they are, and also the delay times of the delay circuits $DLY_1$ to $DLY_k$ are set to 0. Further, the amplification factors of the amplifiers $\mathbf{5}_{FL}$ to $\mathbf{5}_{WF}$ shown in FIG. 1 are made equal.

Then, in step S302, the variable x representing the channel number is set to 1 and a variable AVG is set to 0. Then, in step S304, the sound field characteristic measuring process is carried out to measure the delay times. Then, the processes in steps S304 to S308 are repeated until the sound field characteristic measurement of the first to k-th channels have been completed.

Here, the noise signal DN is supplied to the system circuits $CQT_1$ to $CQT_k$ for every period T by exclusively turning ON the switch elements $SW_{11}$, $SW_{21}$, $SW_{31}$, $SW_{41}$, $SW_{k1}$ for the predetermined period T respectively.

According to this repeating process, the continuous noise signal DN is supplied to the loudspeakers $\mathbf{6}_{FL}$, $\mathbf{6}_{FR}$ $\mathbf{6}_{C}$, $\mathbf{6}_{RL}$, $\mathbf{6}_{RR}$, $\mathbf{6}_{WF}$ for the period T respectively, and then the microphone 8 collects respective reproduced sounds of the noise signal DN being reproduced for the period T respectively. In addition, the phase characteristic correcting portion 13 receives respective sound collecting data DM (referred to as "$DM_1$, $DM_2$, $DM_3$, $DM_4$, $DM_5$, $DM_k$" hereinafter) that are output from the A/D converter 10 for the period T respectively. In this event, since the high-speed sampling is performed for respective periods T by the A/D converter 10, these sound collecting data $DM_1$, $DM_2$, $DM_3$, $DM_4$, $DM_5$, $DM_k$ constitute a plurality of sampling data respectively.

When this measurement has been completed, the process goes to step S310 wherein the phase characteristics of respective channels are calculated. Here, the cross correlation between the sound collecting data $DM_2$ and $DM_1$ is calculated and then a peak interval (phase difference) between resultant correlation values is set as a delay time $\tau$2 in the system circuit $CQT_2$. Also, the cross correlations between remaining sound collecting data $DM_3$ to $DM_k$ and the sound collecting data $DM_1$ are calculated respectively, and then peak intervals (phase differences) between resultant correlation values is set as delay times $\tau$3 to $\tau$k in the system circuits $CQT_3$ to $CQT_k$. That is, the delay times $\tau$2 to $\tau$k in remaining system circuits $CQT_2$ to $CQT_k$ are calculated on the basis of the phase of the sound collecting data $DM_1$ obtained from the system circuit $CQT_1$ (i.e., phase difference 0).

Then, the process goes to step S312 wherein the variable AVG is incremented by 1. Then, in step S314, it is decided whether or not the variable AVG reaches a predetermined value AVERAGE. If NO, the processes starting from step S304 are repeated.

Here, the predetermined value AVERAGE is a constant indicating the number of times of the repeating processes in steps S304 to S312. In the present embodiment, the predetermined value AVERAGE is set to AVERAGE=4.

The delay times $\tau 1$ to $\tau k$ of the system circuit $CQT_1$ to $CQT_k$ are calculated for every four circuits by repeating the four times measuring process in this manner. Then, in step S316, average values $\tau 1'$ to $\tau k'$ of every four delay times $\tau 1$ to $\tau k$ are calculated respectively. These average values $\tau 1'$ to $\tau k'$ are set as the delay times of the system circuit $CQT_1$ to $CQT_k$. The delay times $SDL_1$ to $SDL_k$ are set.

Then, in step S318, the delay times of the delay circuits $DLY_1$ to $DLY_k$ are adjusted based on the adjust signals $SDL_1$ to $SDL_k$ corresponding to the delay times $\tau 1'$ to $\tau k'$. Then, the phase characteristic correcting process has been completed.

In this manner, in the phase characteristic correcting process, the loudspeakers are sounded by supplying the noise signal via the system circuits $CQT_1$ to $CQT_k$ to measure the delay times, and then the phase characteristic is calculated from the sound collecting results of resultant reproduced sounds. Therefore, the delay times of the delay circuits $DLY_1$ to $DLY_k$ are not simply adjusted (corrected) based on only the propagation delay times of the reproduced sounds, but it is possible to implement the total rationalization while taking account of the reproducing capabilities of respective loudspeakers and the characteristic of the system circuits $CQT_1$ to $CQT_k$.

Next, when the phase characteristic correcting process has been completed, the process is shifted to the flatness correcting process in step S40 in FIG. 2. The process in step S40 will be carried out in compliance with a flowchart shown in FIG. 12.

First, in step S400, the noise signal (uncorrelated noise) DN output from the noise generator 3 can be input by switching the switch elements $SW_{11}$ to $SW_{k1}$. Also, the amplification factors of the amplifiers $5_{FL}$ to $5_{WF}$ are made equal.

Then, in step S402, the inter-band attenuator $ATF_{11}$ to $ATF_{ki}$, the channel-to-channel attenuators $ATG_1$ to $ATG_5$, and the delay circuits $DLY_1$ to $DLY_k$ are fixed to their already-adjusted states. However, in step S404, the attenuation factor of the channel-to-channel attenuator $ATG_k$ in the system circuit $CQT_k$ is set to 0 dB.

Then, instep S406, the noise signal (uncorrelated noise) DN is simultaneously supplied to the system circuits $CQT_1$ to $CQT_5$ except the system circuit $CQT_k$. Here, the inter-band attenuators $ATF_{11}$ to $ATF_{1i}$, . . . , $ATF_{51}$, to $ATF_{51}$, in the low frequency band among the inter-band attenuators $ATF_{11}$ to $ATF_{1j}$, . . . , $ATF_{51}$, to $ATF_{5j}$ in the system circuits $CQT_1$ to $CQT_5$ are brought into their OFF (nonconductive) states, and then the above noise signal DN is supplied.

Accordingly, the all frequency band loudspeakers $6_{FL}$, $6_{FR}$, $6_C$, $6_{RL}$, $6_{RR}$ are simultaneously sounded by the noise signal DN in the middle/high frequency band, then the middle/high frequency band processing portion 15*a* receives resultant middle/high frequency band sound collecting data $D_{MH}$ (see FIG. 4), and then a spectrum average level $P_{MH}$ of the reproduced sounds in the middle/high frequency band by the loudspeakers $6_{FL}$, $6_{FR}$, $6_C$, $6_{RL}$, $6_{RR}$ is calculated based on the middle/high frequency band sound collecting data $D_{MH}$.

Then, in step S408, the noise signal (uncorrelated noise) DN is simultaneously supplied to the system circuits $CQT_1$ to $CQT_5$ except the system circuit $CQT_k$. Here, the inter-band attenuators $ATF_{11}$ to $ATF_{1i}$, . . . $ATF_{51}$ to $ATF_{5i}$ in the low frequency band among the inter-band attenuators $ATF_{11}$ to $ATF_{1j}$, . . . , $ATF_{51}$ to $ATF_{5j}$ in the system circuits $CQT_1$ to $CQT_5$ are brought into their ON (conductive) states, and remaining inter-band attenuators are brought into their OFF (nonconductive) states, and then the above noise signal DN is supplied.

Accordingly, the all frequency band loudspeakers $6_{FL}$, $6_{FR}$, $6_C$, $6_{RL}$, $6_{RR}$ are simultaneously sounded by the noise signal DN in the low frequency band, then the low frequency band processing portion 15*b* receives resultant low frequency band sound collecting data $D_L$ (see FIG. 4), and then a spectrum average level $P_L$ of the reproduced sounds in the low frequency band by the loudspeakers $6_{FL}$, $6_{FR}$, $6_C$, $6_{RL}$, $6_{RR}$ is calculated based on the low frequency band sound collecting data $D_L$.

Then, in step S410, the noise signal (pink noise) DN is supplied only to the system circuit $CQT_k$. Here, the inter-band attenuators $ATF_{11}$ to $ATF_{1i}$, . . . , $ATF_{51}$, to $ATF_{5i}$ in the low frequency band among the inter-band attenuators $ATF_{11}$ to $ATF_{1j}$, . . . , $ATF_{51}$ to $ATF_{5j}$ are brought into their ON (conductive) states, and remaining inter-band attenuators are brought into their OFF (nonconductive) states, and then the above noise signal DN is supplied.

Accordingly, only the low frequency band exclusively reproducing loudspeaker $6_{WF}$ is sounded by the noise signal DN, then the subwoofer low frequency band processing portion 15*c* receives resultant subwoofer sound collecting data $D_{WFL}$ (see FIG. 4), and then a spectrum average level $P_{WFL}$ of the reproduced sound in the low frequency band reproduced by the loudspeaker $6_{WF}$ is calculated based on the subwoofer sound collecting data $D_{WFL}$.

In step S412, the calculating portion 15*d* calculates the adjust signal $SG_k$ by executing the calculation expressed by following Eq. (10) to adjust the attenuation factor of the channel-to-channel attenuator $ATG_k$ of the system circuit $CQT_k$.

$$SGk = \frac{TGL \times PMH - TGMH \times PL}{TGMH \times PWFL} \tag{10}$$

That is, if the audio sound is reproduced by virtue of all loudspeakers $6_{FL}$, $6_{CR}$, $6_C$, $6_{RL}$, $6_{RR}$, $6_{WF}$ by executing the calculation in above Eq. (10), the adjust signal $SG_k$ is calculated to make flat the frequency characteristic of the reproduced sound in the sound field space.

Explaining in detail, the adjust signal $SG_k$ for adjusting the attenuation factor of the channel-to-channel attenuator $ATG_k$ is calculated such that a sum of the spectrum average level of the reproduced sound in the low frequency band out of the reproduced sound being simultaneously reproduced by the all frequency band loudspeakers $6_{FL}$, $6_{FR}$, $6_C$, $6_{RL}$, $6_{RR}$ and the spectrum average level of the reproduced sound reproduced by the low frequency band exclusively reproducing subwoofer $6_{WF}$, and the spectrum average level of the reproduced sound in the middle/high frequency band out of the reproduced sound being reproduced simultaneously by the all frequency band loudspeakers $6_{FL}$, $6_{FR}$, $6_C$, $6_{RL}$, $6_{RR}$ are made equal to a ratio of the target characteristic (the characteristic represented by the target curve data).

A coefficient $TG_{MH}$ in above Eq. (10) is an average value of the target curve data corresponding to the middle/high frequency band, out of the target curve data which the listener selects among the target curve data [TGxJ] shown in above Eq. (2) or the default target curve data which the listener does not select. Also, a coefficient $TG_L$ is an average value of the target curve data corresponding to the low frequency band.

Then, in step S414, the attenuation factor of the channel-to-channel attenuator $ATG_k$ is adjusted by using the adjust signal $SG_k$, and then the automatic sound field correcting process has been completed.

In this manner, in the case that the audio sound is reproduced by all frequency band loudspeakers $6_{FL}$, $6_{FR}$, $6_C$, $6_{RL}$, $6_{RR}$, $6_{WF}$, the frequency characteristic of the reproduced sound in the sound field space can be made flat over the full audio frequency range if the level correction is executed finally between the channels by the flatness correcting portion 13. Therefore, the problem in the prior art such as the increase of the low frequency band level shown in FIG. 6 can be overcome.

Also, in the sound field characteristic measuring process in steps S404 to S410, since the reproduced sounds generated by sounding respective loudspeakers $6_{FL}$, $6_{FR}$, $6_{C}$, $6_{RL}$, $6_{RR}$, $6_{WF}$ on time-division basis are collected, the reproducing capabilities (output power) of respective loudspeakers can be detected. Therefore, the total rationalization with taking the reproducing capabilities of respective loudspeakers into consideration can be achieved.

Then, the audio signals $S_{FL}$, $S_{FR}$, $S_C$, $S_{RL}$, $S_{RR}$, $S_{WF}$ from the sound source 1 are set into the normal input state by turning OFF the switch element SWN, turning OFF the switch elements $SW_{11}$, $SW_{21}$, $SW_{31}$, $SW_{41}$, $SW_{51}$, $SW_{k1}$ connected to this switch element, and turning ON the switch elements $SW_{12}$, $SW_{22}$, $SW_{32}$, $SW_{42}$, $SW_{52}$, $SW_{k2}$, and thus the present audio system is brought into the normal audio playback state.

As described above, according to the present embodiment, since the frequency characteristic and the phase characteristic of the sound field space are corrected while totally taking account of the characteristics of the audio system and the loudspeakers, the extremely high quality sound field space with the presence can be provided.

Also, the problem such that the level of the reproduced sound at a certain frequency in the audio frequency band is increased or decreased, e.g., the problem such that the low frequency band level shown in FIG. 6 is increased can be overcome. In other words, since the frequency characteristics of the reproduced sounds being reproduced by respective loudspeakers is made flat over the entire audio frequency band, such a problem can be overcome that the sound offensive to the ear is produced because the level at the certain frequency is enhanced, and thus the very high quality sound field space with the presence can be implemented.

Also, the correction to implement the very high quality sound field space with the presence is made possible by executing the sound field correcting process in the order of steps S10 to S40 shown in FIG. 8.

In addition, since the sound field correction is executed so as to meet to the target curve instructed by the listener, it is possible to improve the convenience, etc.

Further, since the pink noise similar to the frequency characteristic of the audio signal is used in the correction of the frequency characteristic and the correction of the channel-to-channel level and the flattening of level, the correction to meet to the situation that the audio sound is actually reproduced can be achieved with good precision.

In the present embodiment, the automatic sound field correcting system of the so-called 5.1 channel multi-channel audio system that includes the wide frequency range loudspeakers $6_{FL}$ to $6_{RR}$ for five channels and the low frequency band exclusively reproducing loudspeaker $6_{WF}$ has been explained, but the present invention is not limited to this. The automatic sound field correcting system of the present invention can be applied to the multi-channel audio system that includes the loudspeakers that are larger in number than the present embodiment. Also, the automatic sound field correcting system of the present invention can be applied to the audio system that includes the loudspeakers that are smaller in number than the present embodiment.

The sound field correction in the audio system including the low frequency band exclusively reproducing loudspeaker (subwoofer) $6_{WF}$ has been explained, but the present invention is not limited to this. The high quality sound field space with the presence can be provided by the audio system including only the all frequency band loudspeakers without the subwoofer. In this case, all channel characteristics may be corrected by the channel-to-channel level correcting portion 12 not to use the flatness correcting portion 14.

Figure 12:
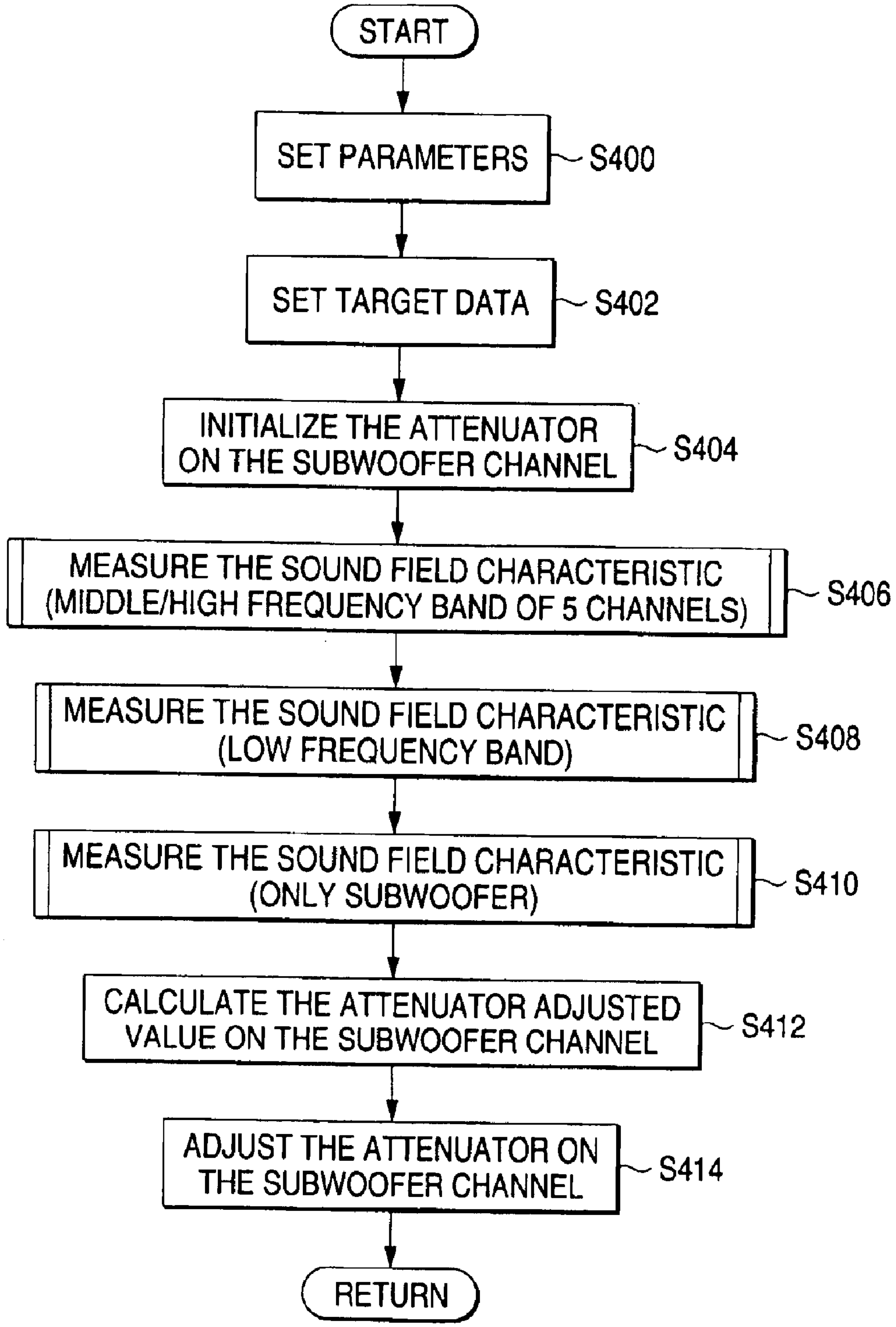
FIG. 12 is a flowchart showing a flatness correcting process.

In the present embodiment, in step S412 shown in FIG. 12, as apparent from above Eq. (10), the rationalization of the attenuation factor of the channel-to-channel attenuator $ATG_K$ is performed on the basis of the levels of the reproduced sounds of all frequency band loudspeakers $6_{FL}$ to $6_{RR}$. That is, the levels of the reproduced sounds of all frequency band loudspeakers $6_{FL}$ to $6_{RR}$ are used as the basis by setting a product of the target data $TG_{MH}$ in the middle/high frequency band and the variable $P_{WFL}$, that corresponds to the level of the reproduced sound of the low frequency band exclusively reproducing loudspeaker $6_{WF}$, in the denominator of above Eq. (10). However, the present invention is not limited to this. The rationalization of the attenuation factors of the channel-to-channel attenuators $ATG_1$ to $ATG_5$ is performed on the basis of the level of the reproduced sound of the low frequency band exclusively reproducing loudspeaker $6_{WF}$.

That is, in the present embodiment, the flatness correcting portion 14 corrects the attenuation factor of the channel-to-channel attenuator $ATG_K$. Conversely, the level of the reproduced sound of the low frequency band exclusively reproducing loudspeaker $6_{WF}$ may be measured, then the attenuation factor of the channel-to-channel attenuator $ATG_K$ may be set on the basis of measured result, and then the attenuation factors of the channel-to-channel attenuators $ATG_1$ to $ATG_5$ may be corrected on the basis of the attenuation factor of the channel-to-channel attenuator $ATG_K$.

Further, as described above, the system circuits CQT1 to CQTk shown in FIG. 2 is constructed by connecting the band-pass filters, the inter-band attenuators, the adder, the channel-to-channel attenuator, and the delay circuit in sequence. However, such configuration is shown as the typical example and thus the present invention is not limited to such configuration.

For example, the delay circuit that is connected following to the channel-to-channel attenuator may be arranged on the input side of the band-pass filters or the input side of the inter-band attenuators. Also, the positions of the channel-to-channel attenuator and the delay circuit may be exchanged. In addition, both the channel-to-channel attenuator and the delay circuit may be arranged on the input side of the band-pass filters.

The reasons for enabling the configuration of the present invention to change appropriately the positions of the constituent elements are that, unlike the conventional audio system in which the correction of the frequency characteristic and the correction of the phase characteristic are performed respectively by separating respective constituent elements, the noise signal from the noise generator can be input from the input stage of the sound field correcting system and also the frequency characteristic and the phase characteristic of the overall sound field correcting system can be corrected totally. As a result, the automatic sound field correcting system of the present invention makes it possible to correct properly the frequency characteristic and the phase characteristic of the overall audio system and to enhance margin in design.

As described above, according to the automatic sound field correcting system according to the present invention, since the sound field correction is performed while taking totally account of the characteristics of the audio system and the loudspeakers, the extremely high quality sound field space with the presence can be provided.

Also, since a new function for making the level of the low frequency band reproduced sound and the level of the middle/high frequency band reproduced sound equal is provided to the audio system including the low frequency band exclusively reproducing loudspeaker and all frequency band loudspeakers, the extremely high quality sound field space with the presence can be provided.

What is claimed is:

1. An automatic sound field correcting system in an audio system for supplying a plurality of input audio signals to a plurality of sound generators via a plurality of signal transmission lines, each of the plurality of signal transmission lines including a frequency divider having a plurality of frequency discriminators each having a frequency discriminating characteristic different in frequency band, a plurality of in-channel level adjustors corresponding to the respective frequency discriminators, for adjusting levels of respective signals that are discriminated by the frequency discriminators, a channel-to-channel level adjustor for adjusting levels of the audio signals, and a delay unit for adjusting delay times of the audio signals, whereby the input audio signals are supplied to the sound generator via the frequency dividers, the in-channel level adjustors, the channel-to-channel level adjustor, and the delay unit, said correcting system comprising:

a noise generator for supplying a noise to the respective signal transmission lines independently in correcting a sound field;

a detector for detecting reproduced sounds generated from the noise reproduced by the respective sound generators;

an in-channel level corrector for correcting an adjusted amount of the plurality of in-channel level adjustors based on detection results of the detector, wherein the in-channel level corrector performs the correction of the adjusted amount of the plurality of in-channel level adjustors with respect to each sound generator;

a channel-to-channel level corrector for correcting an adjusted amount of the plurality of channel-to-channel level adjustors based on the detection results of the detector; and a phase characteristic corrector for calculating phase characteristics of the reproduced sounds reproduced by the sound generator based on the detection results of the detector and also correcting delay times of the delay unit based on calculated phase characteristics, wherein the channel-to-channel level corrector corrects the adjusted amount of the plurality of channel-to-channel level adjustors on the basis of one data of the reproduced sounds having a minimum value with respect to the reproduced sounds, which is extracted through the in-channel level corrector of each sound generator.

2. An automatic sound field correcting system according to claim 1, further comprising:

a controller for causing the in-channel level corrector to correct an adjusted amount of the channel-to-channel level adjustor and causing the phase characteristic corrector to correct the delay times of the delay unit after causing the in-channel level corrector to correct the adjusted amount of the in-channel level adjustor.

3. An automatic sound field correcting system according to claim 1, wherein the noise generator supplies a pink noise independently as the noise.

4. An automatic sound field correcting system according to claim 2, wherein the channel-to-channel level corrector corrects respective adjusted amounts of the plurality of channel-to-channel level adjustor such that a total level of all reproduced sounds reproduced by the plurality of sound generator at a listening position is made substantially equal over a full audio frequency band.

5. An automatic sound field correcting system in an audio system for supplying a plurality of input audio signals to an all-frequency-band sound generator and a low frequency band exclusively reproducing sound generator via a plurality of signal transmission lines, each of the plurality of signal transmission lines including a frequency divider having a plurality of frequency discriminators each having a frequency discriminating characteristic different in frequency band, a plurality of in-channel level adjustors corresponding to the respective frequency discriminators, for adjusting levels of the respective signals that are discriminated by the frequency discriminator, a channel-to-channel level adjustor for adjusting levels of the audio signals, and a delay unit for adjusting delay times of the audio signals, whereby the input audio signals are supplied to the sound generator via the frequency divider, the in-channel level adjustors, the channel-to-channel level adjustor, and the delay unit, said correcting system comprising:

a noise generator for supplying a noise to the respective signal transmission lines independently in correcting a sound field;

a detector for detecting reproduced sounds generated from the noise reproduced by the respective sound generators;

an in-channel level corrector for correcting an adjusted amount of the plurality of in-channel level adjustor based on detection results of the detector, wherein the in-channel level corrector performs the correction of the adjusted amount of the plurality of in-channel level adjustors with respect to each sound generator;

a first channel-to-channel level corrector for correcting an adjusted amount of the plurality of channel-to-channel level adjustors of the signal transmission lines, in which the all-frequency-band sound generator are provided, based on the detection results of the detector;

a second channel-to-channel level corrector for correcting an adjusted amount of the plurality of channel-to-channel level adjustors of the signal transmission lines, in which the low frequency band exclusively reproducing sound generator are provided, based on the detection results of the detector; and a phase characteristic corrector for calculating phase characteristics of the reproduced sounds reproduced by the respective sound generators based on the detection results of the detector and also correcting delay times of the delay unit based on calculated phase characteristics, wherein the first channel-to-channel level corrector corrects the adjusted amount of the plurality of channel-to-channel level adjustors of the signal transmission lines, in which the all-frequency-band sound generator are provided, on the basis of one data of the reproduced sounds having a minimum value with respect to the reproduced sounds, which is extracted through the in-channel level corrector of each sound generator.

6. An automatic sound field correcting system according to claim 5, further comprising:

a controller for causing the first channel-to-channel level corrector to perform the correction, then causing the phase characteristic corrector to perform the correction, and then causing the second channel-to-channel level corrector to perform the correction after causing the in-channel level corrector to perform the correction.

7. An automatic sound field correcting system according to claim 6, wherein the noise generator supplies a pink noise as the noise in the respective corrections of the in-channel level corrector and the first channel-to-channel level corrector, supplies the pink noise as the noise in the respective corrections of the phase characteristic corrector, and supplies the pink noise as the noise in the correction of the second channel-to-channel level corrector.

8. An automatic sound field correcting system according to claim 7, wherein the second channel-to-channel level corrector corrects an adjusted amount of the channel-to-channel level adjustor of the signal transmission line in which a low frequency band exclusively reproducing sound generator is provided such that levels of reproduced sounds reproduced by the all-frequency-band sound generator are set substantially equal to a level of a reproduced sound reproduced by the low frequency band exclusively reproducing sound generator.

9. An automatic sound field correcting system according to claim 1, wherein the phase characteristic corrector calculates a correlation between the detection results of the detector and then detects the phase characteristic based on a correlation value obtained by calculation.

10. The automatic sound field correcting system according to claim 1, wherein the detection results of the detector comprise sound collecting data, wherein one data of the sound collecting data, having a minimum value with respect to the sound collecting data, is set as a target data.

11. The automatic sound field correcting system according to claim 10, wherein the target data and the sound collecting data are utilized in the channel-to-channel level corrector correction.

* * * * *